United States Patent
Kamimura

(10) Patent No.: US 12,098,301 B2
(45) Date of Patent: Sep. 24, 2024

(54) POLISHING LIQUID AND CHEMICAL MECHANICAL POLISHING METHOD

(71) Applicant: FUJIFILM Corporation, Tokyo (JP)

(72) Inventor: Tetsuya Kamimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 413 days.

(21) Appl. No.: 17/524,684

(22) Filed: Nov. 11, 2021

(65) Prior Publication Data
US 2022/0064490 A1     Mar. 3, 2022

Related U.S. Application Data

(63) Continuation of application No. PCT/JP2020/019627, filed on May 18, 2020.

(30) Foreign Application Priority Data

Jun. 20, 2019    (JP) .................................. 2019-114608

(51) Int. Cl.
    *C09G 1/02*         (2006.01)
    *C09G 1/04*         (2006.01)
    (Continued)

(52) U.S. Cl.
    CPC .................. *C09G 1/02* (2013.01); *C09G 1/04* (2013.01); *C09K 3/1409* (2013.01); *H01L 21/304* (2013.01)

(58) Field of Classification Search
    CPC .......... C09G 1/02; C09G 1/04; C09K 3/1409; H01L 21/304; H01L 21/3212
    See application file for complete search history.

(56) References Cited

U.S. PATENT DOCUMENTS 9,486,892 B2    11/2016   Onishi et al.
2009/0246956 A1*  10/2009  Takamiya ............ C09K 3/1409
                                                    438/693
(Continued)

FOREIGN PATENT DOCUMENTS

JP    2004273650    9/2004
JP    2014229827   12/2014
(Continued)

OTHER PUBLICATIONS

"International Search Report (Form PCT/ISA/210) of PCT/JP2020/019627," mailed on Aug. 11, 2020, with English translation thereof, pp. 1-6.
(Continued)

*Primary Examiner* — Binh X Tran
(74) *Attorney, Agent, or Firm* — JCIPRNET

(57) ABSTRACT

The present invention provides a polishing liquid which reduces the occurrence of dishing and erosion on a surface to be polished of an object to be polished having a cobalt-containing film after polishing in a case where the polishing liquid is applied to CMP of the object to be polished, and makes it possible to manufacture a semiconductor product having excellent reliability. The present invention also provides a chemical mechanical polishing method using the polishing liquid. The polishing liquid of an embodiment of the present invention is a polishing liquid used for chemical mechanical polishing of an object to be polished having a cobalt-containing film, and includes a colloidal silica, an organic acid, a passivation film forming agent, an anionic surfactant; hydrogen peroxide; potassium; and sodium, in which a value of a difference obtained by subtracting the ClogP value of the passivation film forming agent from the ClogP value of the anionic surfactant is more than 2.00 and less than 8.00, a mass ratio of a content of potassium to a (Continued)

content of sodium is $1 \times 10^6$ to $1 \times 10^9$, and the pH is 8.0 to 10.5.

23 Claims, 2 Drawing Sheets

(51) Int. Cl.
*C09K 3/14* (2006.01)
*H01L 21/304* (2006.01)

(56) References Cited

U.S. PATENT DOCUMENTS

| | | | | |
|---|---|---|---|---|
| 2009/0311864 | A1* | 12/2009 | Yamada | H01L 21/31053 438/693 |
| 2010/0075500 | A1* | 3/2010 | Yoshikawa | B24B 37/044 438/692 |
| 2010/0184291 | A1* | 7/2010 | Shin | C09G 1/02 438/692 |
| 2016/0122590 | A1* | 5/2016 | Lew | C09G 1/02 438/693 |
| 2017/0009101 | A1* | 1/2017 | Yasui | B24B 37/044 |
| 2017/0158913 | A1 | 6/2017 | Reichardt et al. | |
| 2017/0362466 | A1* | 12/2017 | Shi | H01L 21/3212 |

FOREIGN PATENT DOCUMENTS

| | | |
|---|---|---|
| JP | 2017107918 | 6/2017 |
| JP | 2017157591 | 9/2017 |
| JP | 2017527654 | 9/2017 |
| JP | 2018093183 | 6/2018 |
| KR | 1020150083085 | 7/2015 |
| WO | 2018159530 | 9/2018 |

OTHER PUBLICATIONS

"Written Opinion of the International Searching Authority (Form PCT/ISA/237)" of PCT/JP2020/019627, mailed on Aug. 11, 2020, with English translation thereof, pp. 1-8.

"Office Action of Korea Counterpart Application", issued on Nov. 28, 2023, with English translation thereof, p. 1-p. 13.

"Notice of Reasons for Refusal of Japan Counterpart Application", issued on Nov. 1, 2022, with English translation thereof, p. 1-p. 8.

* cited by examiner

POLISHING LIQUID AND CHEMICAL MECHANICAL POLISHING METHOD

CROSS-REFERENCE TO RELATED APPLICATIONS

This application is a Continuation of PCT International Application No. PCT/JP2020/019627 filed on May 18, 2020, which claims priority under 35 U.S.C. § 119(a) to Japanese Patent Application No. 2019-114608 filed on Jun. 20, 2019. The above application is hereby expressly incorporated by reference, in its entirety, into the present application.

BACKGROUND OF THE INVENTION

1. Field of the Invention

The present invention relates to a polishing liquid and a chemical mechanical polishing method.

2. Description of the Related Art

In the manufacture of a semiconductor integrated circuit (large-scale integrated circuit LSI), a chemical mechanical polishing (CMP) method is used for flattening a bare wafer, flattening an interlayer insulating film, forming a metal plug, forming an embedded wiring line, and the like.

For example, JP2014-229827A discloses an aqueous dispersion for chemical mechanical polishing, which includes "(A) abrasive grains, (B) an organic acid having 4 or more carbon atoms, which has π electrons and one or more carboxyl groups, and has two or more of at least one kind of groups selected from the group consisting of a carboxyl group and a hydroxyl group, (C) an amino acid, (D) an anionic surfactant, and (E) an oxidizing agent, and has a pH of 6.5 or more and 9.5 or less".

SUMMARY OF THE INVENTION

By the way, cobalt has recently been attracting attention as a wiring line metal element instead of copper due to a demand for miniaturization of a wiring line.

The present inventors have examined an aqueous dispersion for chemical mechanical polishing described in JP2014-229827A as a polishing liquid used for CMP of an object to be polished having a cobalt-containing film, and have thus confirmed that there is room for an improvement in a dishing suppressing property (dishing: phenomenon in which a surface of a wiring line exposed to a surface to be polished has a dish-shaped indentation by polishing in a case where the wiring line is formed by CMP) on a surface to be polished of an object to be polished after polishing. In addition, the polishing liquid is required to enable suppression of erosion (phenomenon in which portions other than a wiring line are partially scraped in a case where the wiring line is formed by CMP), and is also required to enable enhanced reliability of a semiconductor product manufactured using an object to be polished after polishing.

Therefore, an object of the present invention is to provide a polishing liquid which reduces the occurrence of dishing and erosion on a surface to be polished of an object to be polished having a cobalt-containing film after polishing in a case where the polishing liquid is applied to CMP of the object to be polished, and makes it possible to manufacture a semiconductor product having excellent reliability.

In addition, another object of the present invention is to provide a chemical mechanical polishing method using the polishing liquid.

The present inventors have found that the objects can be accomplished by the following configurations.

[1] A polishing liquid used for chemical mechanical polishing of an object to be polished having a cobalt-containing film, the polishing liquid comprising:
colloidal silica;
one or more organic acids selected from the group consisting of polycarboxylic acid and polyphosphonic acid;
one or more passivation film forming agents selected from the group consisting of a compound represented by General Formula (1) and a compound represented by General Formula (2);
an anionic surfactant;
hydrogen peroxide;
potassium; and
sodium, and
in which a value of a difference obtained by subtracting the ClogP value of the passivation film forming agent from the ClogP value of the anionic surfactant is more than 2.00 and less than 8.00,
a mass ratio of a content of potassium to a content of sodium is $1 \times 10^6$ to $1 \times 10^9$, and
a pH is 8.0 to 10.5.

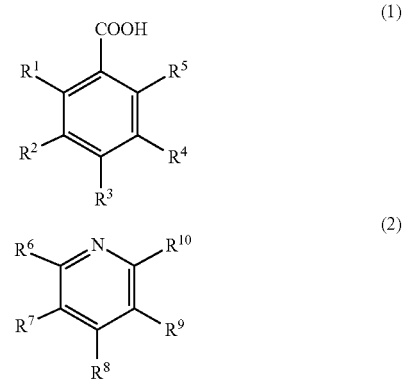

in General Formula (1), $R^1$ to $R^5$ each independently represent a hydrogen atom or a substituent, and
two adjacent groups in $R^1$ to $R^5$ may be bonded to each other to form a ring, and
in General Formula (2), $R^6$ to $R^{10}$ each independently represent a hydrogen atom or a substituent, and
two adjacent groups in $R^6$ to $R^{10}$ may be bonded to each other to form a ring.

[2] The polishing liquid as described in [1],
in which a mass ratio of a content of the passivation film forming agent to a content of the anionic surfactant is 0.01 or more and less than 100.

[3] The polishing liquid as described in [1] or [2],
in which a corrosion potential of cobalt in the polishing liquid is −0.2 to 0.5 V.

[4] The polishing liquid as described in any one of [1] to [3],
in which the organic acid is one or more selected from the group consisting of citric acid, maleic acid, succinic acid, 1-hydroxyethane-1,1-diphosphonic acid, and ethylenediaminetetramethylenephosphonic acid.

[5] The polishing liquid as described in any one of [1] to [4],
in which a content of the colloidal silica is 2.0% by mass or more with respect to a total mass of the polishing liquid, and
the colloidal silica has an average primary particle diameter of 5 nm or more.
[6] The polishing liquid as described in any one of [1] to [5], further comprising a benzotriazole compound.
[7] The polishing liquid as described in [6],
in which a mass ratio of a content of the passivation film forming agent to the content of the benzotriazole compound is 40 to 300.
[8] The polishing liquid as described in any one of [1] to [7],
in which the anionic surfactant has one or more anionic groups selected from the group consisting of a carboxylic acid group, a sulfonic acid group, a phosphoric acid group, a phosphonic acid group, a sulfuric acid ester group, a phosphoric acid ester group, and a group which is a salt thereof.
[9] The polishing liquid as described in any one of [1] to [8],
in which the ClogP value of the passivation film forming agent is 1.00 to 3.80.
[10] The polishing liquid as described in any one of [1] to [9],
in which the passivation film forming agent is one or more selected from the group consisting of 4-methylphthalic acid, 4-nitrophthalic acid, salicylic acid, 4-methylsalicylic acid, anthranilic acid, 4-methylbenzoic acid, 4-tert-butylbenzoic acid, 4-propylbenzoic acid, 1,4,5,8-naphthalenetetracarboxylic acid, 6-hydroxy-2-naphthalenecarboxylic acid, 1-hydroxy-2-naphthalenecarboxylic acid, 3-hydroxy-2-naphthalenecarboxylic acid, quinaldic acid, 8-hydroxyquinoline, and 2-methyl-8-hydroxyquinoline.
[11] The polishing liquid as described in any one of [1] to [10], further comprising an organic solvent in an amount of 0.05% to 5.0% by mass with respect to a total mass of the polishing liquid.
[12] The polishing liquid as described in any one of [1] to [11], further comprising a nonionic surfactant.
[13] The polishing liquid as described in [12],
in which an HLB value of the nonionic surfactant is 8 to 15.
[14] The polishing liquid as described in any one of [1] to [13],
in which a mass ratio of a content of the organic acid to a content of hydrogen peroxide is 0.05 to 1.0.
[15] The polishing liquid as described in any one of [1] to [14],
in which a concentration of solid contents is 10% by mass or more, and
the polishing liquid is used after 2-times or more dilution on a mass basis.
[16] A chemical mechanical polishing method comprising a step of obtaining an object to be polished, which has been polished, by bringing a surface to be polished of the object to be polished into contact with a polishing pad attached to a polishing platen while supplying the polishing liquid as described in any one of [1] to [14] to the polishing pad, and relatively moving the object to be polished and the polishing pad to polish the surface to be polished.
[17] The chemical mechanical polishing method as described in [16],
in which the method is performed to form a wiring line consisting of a cobalt-containing film.
[18] The chemical mechanical polishing method as described in [16] or [17],
in which the object to be polished has a second layer consisting of a material different from that of the cobalt-containing film, and
a ratio of a polishing speed of the cobalt-containing film to a polishing speed of the second layer is more than 0.05 and less than 5.
[19] The chemical mechanical polishing method as described in [18],
in which the second layer includes one or more materials selected from the group consisting of Ta, TaN, TiN, SiN, tetraethoxysilane, SiC, and SiOC.
[20] The chemical mechanical polishing method as described in any one of [16] to [19],
in which a polishing pressure is 0.5 to 3.0 psi.
[21] The chemical mechanical polishing method as described in any one of [16] to [20],
in which a supply rate of the polishing liquid supplied to the polishing pad is 0.14 to 0.35 ml/(min·cm$^2$).
[22] The chemical mechanical polishing method as described in any one of [16] to [21], further comprising a step of cleaning the object to be polished, which has been polished, with an alkaline cleaning liquid after the step of obtaining the object to be polished, which has been polished.
[23] A polishing liquid used for chemical mechanical polishing of an object to be polished, the polishing liquid comprising:
abrasive grains;
one or more organic acids selected from the group consisting of polycarboxylic acid and polyphosphonic acid;
one or more passivation film forming agents selected from the group consisting of a compound represented by General Formula (1) and a compound represented by General Formula (2);
an anionic surfactant;
hydrogen peroxide;
potassium; and
sodium, and
in which a value of a difference obtained by subtracting the ClogP value of the passivation film forming agent from the ClogP value of the anionic surfactant is more than 2.00 and less than 8.00,
a mass ratio of a content of potassium to a content of sodium is $1\times10^6$ to $1\times10^9$, and
a pH is 8.0 to 10.5.

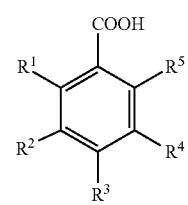

(1)

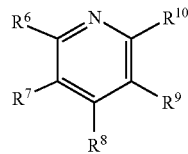

(2)

In General Formula (1), $R^1$ to $R^5$ each independently represent a hydrogen atom or a substituent.

Two adjacent groups in $R^1$ to $R^5$ may be bonded to each other to form a ring.

In General Formula (2), $R^6$ to $R^{10}$ each independently represent a hydrogen atom or a substituent.

Two adjacent groups in $R^6$ to $R^{10}$ may be bonded to each other to form a ring.

According to the present invention, it is possible to provide a polishing liquid which reduces the occurrence of dishing and erosion on a surface to be polished of an object to be polished having a cobalt-containing film after polishing in a case where the polishing liquid is applied to CMP of the object to be polished, and makes it possible to manufacture a semiconductor product having excellent reliability.

In addition, it is also possible to provide a chemical mechanical polishing method using the polishing liquid.

DESCRIPTION OF THE PREFERRED EMBODIMENTS

Figure 1:
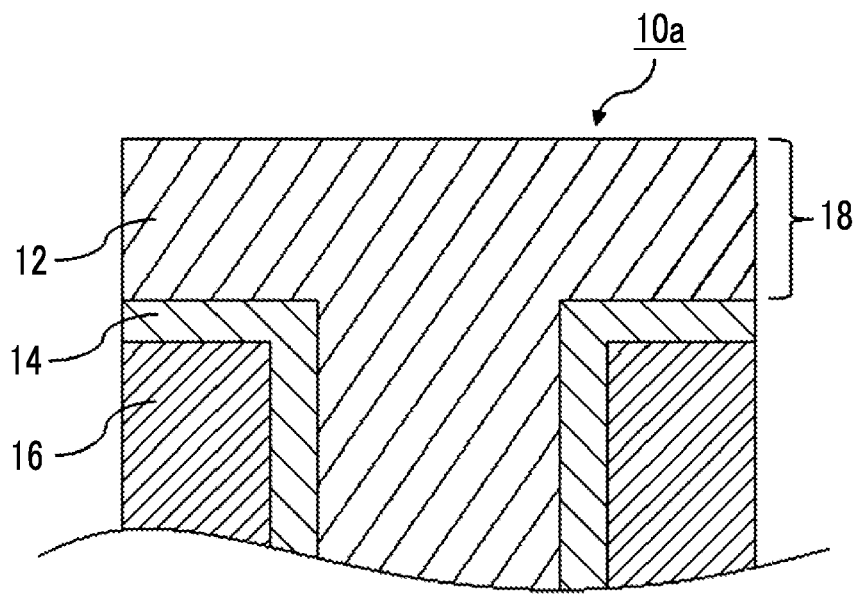
FIG. 1 is a schematic view of an upper part of a cross-section showing an example of an object to be pretreated, which is subjected to a pretreatment for obtaining an object to be polished for which a chemical mechanical polishing method of an embodiment of the present invention is carried out.

Hereinafter, the present invention will be described in detail.

Descriptions on the configuration requirements which will be described later are made based on representative embodiments of the present invention in some cases, but it should not be construed that the present invention is limited to such embodiments.

In addition, in the present specification, a numerical value range expressed using "to" means a range that includes the preceding and succeeding numerical values of "to" as the lower limit value and the upper limit value, respectively.

Incidentally, in the present invention, "ppm" means "parts-per-million ($10^{-6}$)", "ppb" means "parts-per-billion ($10^{-9}$)", and "ppt" means "parts-per-trillion ($10^{-12}$)".

In the present specification, the ClogP value is a value determined by calculation of a common logarithm log P of a partition coefficient P between 1-octanol and water. With regard to a method or software used for calculation of the ClogP value, a known method or software can be used, but in the present invention, a ClogP program incorporated into ChemBioDraw Ultra 12.0 from Cambridge Soft is used unless otherwise specified.

In the present specification, the pH can be measured by a pH meter, and a measurement temperature is 25° C. Incidentally, a product name, "LAQUA Series" (manufactured by HORIBA, Ltd.), can be used for the pH meter.

In the present specification, psi means a pound-force per square inch; 1 psi=6,894.76 Pa.

[Polishing Liquid]

The polishing liquid of an embodiment of the present invention (hereinafter also referred to as "the present polishing liquid") is a polishing liquid used for chemical mechanical polishing (CMP) of an object to be polished (preferably an object to be polished having a cobalt-containing film), the polishing liquid including abrasive grains (preferably colloidal silica); one or more organic acids selected from the group consisting of polycarboxylic acid and polyphosphonic acid; one or more passivation film forming agents selected from the group consisting of a compound represented by General Formula (1) which will be described later and a compound represented by General Formula (2) which will be described later; an anionic surfactant; hydrogen peroxide; potassium; and sodium, in which a value of a difference obtained by subtracting the ClogP value of the passivation film forming agent from the ClogP value of the anionic surfactant is more than 2.00 and less than 8.00, a mass ratio of an content of potassium to a content of sodium is $1 \times 10^6$ to $1 \times 10^9$, and a pH is 8.0 to 10.5.

Mechanism by which a desired effect can be obtained with a polishing liquid having such a configuration is not necessarily clear, but is speculated by the present inventors to be as follows.

That is, the organic acid is chemically moderately active against cobalt at a predetermined pH, and realizes an action as a polishing liquid with respect to an object to be polished having a cobalt-containing film in cooperation with hydrogen peroxide, abrasive grains (preferably colloidal silica), and the like. On the other hand, a predetermined passivation film forming agent is added to suppress excessive polishing by the polishing liquid, and dishing on a surface to be polished is suppressed at a predetermined pH. In addition, in a case where a mass ratio of the content of potassium to the content of sodium is no more than an upper limit of a predetermined value, the aggregation of abrasive grains (preferably colloidal silica) in the present polishing liquid is suppressed, which contributes to the suppression of erosion and the like. Further, it is presumed that in a case where the mass ratio is no less than a lower limit of a predetermined value, the migration in the object to be polished is reduced and the reliability of a semiconductor product manufactured is improved.

Hereinafter, with regard to the polishing liquid, satisfaction of at least one or more of excellence in a reduction in the occurrence of dishing on a surface to be polished (simply referred to as an excellent dishing suppressing property), excellence in a reduction in the occurrence of erosion on a surface to be polished (simply referred to as an excellent erosion suppressing property), and excellent reliability of a semiconductor product thus manufactured (also simply referred to as excellent reliability) is also expressed as follows: the effect of the present invention is excellent.

Hereinafter, components that are included in the present polishing liquid and components that can be included in the present polishing liquid will be described.

In addition, each component which will be described below may be ionized in the present polishing liquid. For example, in a case where a compound (ion) in which a carboxylic acid group (—COOH) in a compound represented by General Formula (1) which will be described later serves as a carboxylate anion (—COO—) is included in the polishing liquid, the present polishing liquid is considered to include the compound represented by General Formula (1). In addition, in a case where the present polishing liquid includes an ammonium ion ($NH_4^+$), the polishing liquid is considered to include ammonia ($NH_3$).

Incidentally, the content of each component in the following description is intended to be a content obtained by assuming the component existing in the state of being ionized in the present polishing liquid as a component in the state of being not ionized.

It should be noted that in a case where the contents of sodium and potassium are mentioned, the contents are each intended to be based on the masses of a sodium atom and a potassium atom.

<Colloidal Silica (Abrasive Grains)>

The present polishing liquid includes colloidal silica (silica colloidal particles). The colloidal silica functions as abrasive grains for polishing an object to be polished.

In another aspect of the present invention, the present polishing liquid includes abrasive grains. Examples of the abrasive grains include inorganic abrasive grains such as silica, alumina, zirconia, ceria, titania, germania, and silicon carbide; and organic abrasive grains such as polystyrene, polyacryl, and polyvinyl chloride. Among those, the silica particles are preferable as the abrasive grains from the viewpoint that the dispersion stability in the polishing liquid is excellent and the number of scratches (polishing flaws) generated by CMP is small.

The silica particles are not particularly limited, and examples thereof include precipitated silica, fumed silica, and colloidal silica. Among those, the colloidal silica is more preferable.

The present polishing liquid is preferably a slurry.

An average primary particle diameter of the colloidal silica is preferably 60 nm or less, and more preferably 30 nm or less from the viewpoint that generation of defects on a surface to be polished can be further suppressed.

The lower limit value of the average primary particle diameter of the colloidal silica is preferably 1 nm or more, more preferably 3 nm or more, and still more preferably 5 nm or more from the viewpoint that the aggregation of the colloidal silica is suppressed and the temporal stability of the present polishing liquid is thus improved.

An average primary particle diameter is obtained by measuring particle diameters (equivalent circle diameters) of any 1,000 primary particles selected from an image captured using a transmission electron microscope TEM2010 (pressurization voltage: 200 kV) manufactured by JEOL Ltd., and arithmetically averaging the values. Incidentally, the equivalent circle diameter is a diameter of a circle assuming a true circle having the same projected area as a projected area of a particle at the time of observation.

It should be noted that in a case where a commercially available product is used as the colloidal silica, a catalog value is preferentially adopted as the average primary particle diameter of the colloidal silica.

An average aspect ratio of the colloidal silica is preferably 1.5 to 2.0, more preferably 1.55 to 1.95, and particularly preferably 1.6 to 1.9 from the viewpoint where a polishing power is improved.

The average aspect ratio of the colloidal silica is obtained by measuring a major diameter and a minor diameter for every arbitrary 100 particles observed with the above-mentioned transmission electron microscope to calculate aspect ratios (major diameter/minor diameter) of the respective particles, and arithmetically averaging the aspect ratios of the 100 particles. Incidentally, the major diameter of a particle means a length of the particle in a major axis direction, and the minor diameter of a particle means a length of the particle in a direction orthogonal to the major axis direction of the particle.

It should be noted that in a case where a commercially available product is used as the colloidal silica, a catalog value is preferentially adopted as the average aspect ratio of the colloidal silica.

A degree of association of the colloidal silica is preferably 1 to 3 from the viewpoint that the polishing speed is further increased.

In the present specification, the degree of association is determined by an equation: Degree of association=Average secondary particle diameter/Average primary particle diameter. An average secondary particle diameter corresponds to an average particle diameter (equivalent circle diameter) of secondary particles in an aggregated state, and can be determined by the same method as for the average primary particle diameter.

It should be noted that in a case where a commercially available product is used as the colloidal silica, a catalog value is preferentially adopted as the degree of association of the colloidal silica.

The colloidal silica may have a surface modifying group (a sulfonic acid group, a phosphonic acid group, and/or a carboxylic acid group, and the like) on the surface.

Incidentally, the group may be ionized in the polishing liquid.

A method for obtaining colloidal silica having a surface modifying group is not particularly limited, and examples thereof include the method described in JP2010-269985A.

As the colloidal silica, a commercially available product may be used, and examples thereof include PL1, PL3, PL7, PL10H, PL1D, PL07D, PL2D, and PL3D (all of which are product names, manufactured by Fuso Chemical Co., Ltd.).

The lower limit value of the content of the colloidal silica is preferably 0.1% by mass or more, more preferably 2.0% by mass or more, and still more preferably 3.0% by mass or more with respect to the total mass (100% by mass) of the present polishing liquid from the viewpoint that the effect of the present invention is more excellent. The upper limit value is preferably 15% by mass or less, more preferably 10% by mass or less, and still more preferably 5.5% by mass or less with respect to a total mass of the present polishing liquid.

The colloidal silica may be used alone or in combination of two or more kinds thereof. In a case where two or more kinds of the colloidal silica are used, a total content thereof is preferably within the range.

A suitable range of the content of the abrasive grains in the present polishing liquid is the same as the suitable range of the content of the colloidal silica described above.

<Organic Acid>

The present polishing liquid includes an organic acid.

The organic acid is preferably different from a passivation film forming agent which will be described later, and specifically, it is preferable that the organic acid does not correspond to the compound represented by General Formula (1) and the compound represented by General Formula (2).

In addition, the organic acid is preferably different from a surfactant (particularly an anionic surfactant).

The organic acid is one or more selected from the group consisting of polycarboxylic acid and polyphosphonic acid.

The polycarboxylic acid is a compound having 2 or more (preferably 2 to 4) carboxylic acid groups (—COOH) in one molecule, and the polyphosphonic acid is a compound having 2 or more (preferably 2 to 4) phosphonic acid groups (—P(=O)(OH)$_2$) in one molecule.

Examples of the polycarboxylic acid include citric acid, maleic acid, and succinic acid.

Examples of the polyphosphonic acid include 1-hydroxyethane-1,1-diphosphonic acid and ethylenediaminetetramethylenephosphonic acid.

It is also preferable to use two or more kinds of the organic acids.

Examples of a combination of two or more kinds used include a combination of citric acid and malonic acid, and a combination of malonic acid and ethylenediaminetetramethylenephosphonic acid.

In a case where two or more kinds of the organic acids are used, a mass ratio (content of the organic acid with the second highest content of the organic acid with the highest content) of an content of the organic acid with the second highest content to a content of the organic acid with the highest content is preferably 0.1 to 1.0, and more preferably 0.2 to 1.0. Incidentally, the content of the organic acid with the highest content may be substantially the same as the content of the organic acid with the second highest content.

The content of the organic acid is preferably 0.001% to 5% by mass, and more preferably 0.1% to 1.5% by mass with respect to a total mass of the present polishing liquid.

In a case where two or more kinds of the specific compounds are used, a total content thereof is preferably within the range.

<Passivation Film Forming Agent>

The present polishing liquid includes a passivation film forming agent.

The passivation film forming agents used in the present polishing liquid are one or more passivation film forming agents selected from the group consisting of a compound represented by General Formula (1) and a compound represented by General Formula (2).

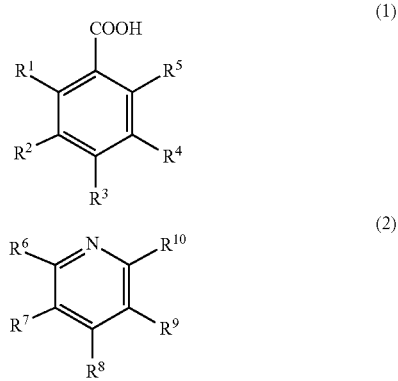

In General Formula (1), $R^1$ to $R^5$ each independently represent a hydrogen atom or a substituent.

Examples of the substituent include an alkyl group (which may be linear or branched, and preferably has 1 to 6 carbon atoms), a nitro group, an amino group, a hydroxyl group, and a carboxylic acid group.

Two adjacent groups in $R^1$ to $R^5$ may be bonded to each other to form a ring.

Examples of the ring formed by bonding two adjacent groups of $R^1$ to $R^5$ to each other include an aromatic ring (which may be a monocyclic ring or a polycyclic ring, and is preferably a benzene ring or a pyridine ring). The ring (preferably an aromatic ring, and more preferably a benzene ring or a pyridine ring) may further have a substituent.

In General Formula (2), $R^6$ to $R^{10}$ each independently represent a hydrogen atom or a substituent.

Examples of the substituent include an alkyl group (which may be linear or branched, and preferably has 1 to 6 carbon atoms), a nitro group, an amino group, a hydroxyl group, and a carboxylic acid group.

Two adjacent groups in $R^6$ to $R^{10}$ may be bonded to each other to form a ring.

Examples of the ring formed by bonding two adjacent groups of $R^6$ to $R^{10}$ to each other include an aromatic ring (which may be a monocyclic ring or a polycyclic ring, and is preferably a benzene ring or a pyridine ring). The ring (preferably an aromatic ring, and more preferably a benzene ring or a pyridine ring) may further have a substituent.

A ClogP value of the passivation film forming agent used in the present polishing liquid is preferably 0.80 or more, more preferably 1.00 or more, and still more preferably 1.00 to 3.80.

The passivation film forming agent is preferably one or more selected from the group consisting of 4-methylphthalic acid, 4-nitrophthalic acid, salicylic acid, 4-methylsalicylic acid, anthranilic acid, 4-methylbenzoic acid, 4-tert-butylbenzoic acid, 4-propylbenzoic acid, 1,4,5,8-naphthalenetetracarboxylic acid, 6-hydroxy-2-naphthalenecarboxylic acid, 1-hydroxy-2-naphthalenecarboxylic acid, 3-hydroxy-2-naphthalenecarboxylic acid, quinaldic acid, 8-hydroxyquinoline, and 2-methyl-8-hydroxyquinoline.

In addition, phthalic acid and the like can be mentioned as a passivation film forming agent.

A content of the passivation film forming agent is preferably 0.0001% to 5.0% by mass, and more preferably 0.0005% to 1.0% by mass by mass with respect to a total mass of the present polishing liquid from the viewpoint that the effect of the present invention is more excellent.

The passivation film forming agents may be used alone or in combination of two or more kinds thereof. In a case where two or more kinds of the passivation film forming agents are used, a total content thereof is preferably within the range.

<Sodium and Potassium>

The present polishing liquid includes sodium and potassium.

In the present polishing liquid, sodium and potassium may exist in the state of particles (particles including sodium and/or potassium, or the like), or may exist in the state of ions.

A content of sodium is preferably 1 to 250 ppt by mass, and more preferably 10 to 150 ppt by mass with respect to the total mass of the present polishing liquid.

A content of potassium is preferably $1.0 \times 10^5$ to $9.0 \times 10^9$ ppt by mass, and more preferably $1.0 \times 10^7$ to $5.0 \times 10^9$ ppt by mass, and still more preferably $1.0 \times 10^8$ to $1.0 \times 10^9$ ppt by mass.

The contents of sodium and potassium in the present polishing liquid can be each measured by an ICP-MS method. In the ICP-MS method, the contents of sodium and potassium as a target to be measured are measured regardless of existence forms thereof.

Sodium and/or potassium in the polishing liquid may be introduced into the polishing liquid as a component included as a trace component (impurity) in a raw material used for the production of the present polishing liquid or may be introduced as a cation in a raw material which is a salt (a surfactant which is a salt), or a raw material which serves as a supply source of sodium and potassium (sodium hydroxide, potassium hydroxide, and the like) may be individually added and introduced at the time of production of the present polishing liquid.

A mass ratio (content of potassium/content of sodium (K/Na)) of the content of potassium to the content of sodium in the present polishing liquid is $1\times10^6$ to $1\times10^9$.

K/Na is preferably $2\times10^6$ to $1\times10^8$ from the viewpoint that a balance of the performance of the present polishing liquid is excellent.

<Anionic Surfactant>

The present polishing liquid includes an anionic surfactant.

The anionic surfactant is preferably a compound different from the above-mentioned organic acid.

The anionic surfactant is preferably a compound different from the above-mentioned passivation film forming agent.

In the present invention, the anionic surfactant is not particularly limited, but typically means an anionic compound having a hydrophilic group and a lipophilic group in the molecule, in which the hydrophilic group portion is dissociated in an aqueous solution to serve as an anion or have an anionic property. Here, the anionic surfactant may be present as an acid accompanied by a hydrogen atom, may be a dissociated anion, or may be a salt thereof. As long as the surfactant is anionic, it may be non-dissociative and includes an acid ester and the like.

The anionic surfactant is preferably an anionic surfactant having one or more anionic groups selected from the group consisting of a carboxylic acid group, a sulfonic acid group, a phosphoric acid group, a phosphonic acid group, a sulfuric acid ester group, a phosphoric acid ester group, and a group which is a salt thereof.

In other words, the anionic surfactant is preferably an anionic surfactant having one or more anions selected from the group consisting of a carboxylate anion ($-COO^-$), a sulfonate anion ($-SO_3^-$), a phosphate anion ($-OPO_3H^-$, $-OPO_3^{2-}$), a phosphonate anion ($-PO_3H^-$, $-PO_3^{2-}$), a sulfuric acid ester anion ($-OSO_3^-$), a phosphoric acid ester anion ($*-O-P(=O)O^--O-*$, in which * represents a bonding position with an atom other than a hydrogen atom), in the present polishing liquid.

In addition, the anionic surfactant preferably has two or more of the anionic groups. In this case, the two or more anionic groups which are present may be the same as or different from each other.

Examples of the anionic surfactant include a sulfonic acid compound, an alkyl sulfuric acid ester, an alkyl sulfonic acid, an alkylbenzenesulfonic acid (preferably having 8 to 20 carbon atoms), an alkylnaphthalenesulfonic acid, an alkyldiphenyl ether sulfonic acid, a polyoxyethylene alkyl ether carboxylic acid, a polyoxyethylene alkyl ether acetic acid, a polyoxyethylene alkyl ether propionic acid, an alkyl phosphate, and a salt thereof. Examples of the "salt" include an ammonium salt, a sodium salt, a potassium salt, a trimethylammonium salt, and a triethanolamine salt.

A ClogP value of the anionic surfactant is preferably 1.00 to 15.00, more preferably 2.50 to 12.00, and still more preferably 3.00 to 11.50.

In addition, a value of a difference (ClogP value of the anionic surfactant—ClogP value of the passivation film forming agent) obtained by subtracting the ClogP value of the passivation film forming agent from the ClogP value of the anionic surfactant is more than 2.00 and less than 8.00. In other words, the passivation film forming agent and the anionic surfactant in the present polishing liquid satisfy the following relationship.

"The ClogP value of passivation film forming agent satisfies ClogP value of passivation film forming agent+ 2.00<ClogP value of the anionic surfactant<ClogP value of the passivation film forming agent+8.00"

A value of a difference obtained by subtracting the ClogP value of the passivation film forming agent from the ClogP value of the anionic surfactant is preferably 2.05 to 7.90.

In a case where the present polishing liquid includes two or more kinds of the passivation film forming agents and/or the anionic surfactants, it is preferable that a combination of at least one set of a passivation film forming agent and an anionic surfactant (preferably a combination of a passivation film forming agent with the highest content and an anionic surfactant with the highest content) satisfies the range of the values of the difference.

In a case where the present polishing liquid includes the anionic surfactant, a content of the anionic surfactant is preferably 0.005% to 5.0% by mass, and more preferably 0.04% to 0.3% by mass with respect to the total mass of the present polishing liquid from the viewpoint that the effect of the present invention is more excellent.

The anionic surfactants may be used alone or in combination of two or more kinds thereof. In a case where two or more kinds of the anionic surfactants are used, a total content thereof is preferably within the range.

A mass ratio (content of the passivation film forming agent/content of the anionic surfactant) of the content of the passivation film forming agent to the content of the anionic surfactant is preferably 0.001 to 300, more preferably 0.01 or more and less than 100, and still more preferably 0.01 to 50.

<Hydrogen Peroxide>

The present polishing liquid includes hydrogen peroxide ($H_2O_2$).

A content of hydrogen peroxide is preferably 0.1% to 10.0% by mass, more preferably 0.2% to 5.0% by mass, and still more preferably 0.5% to 3.0% by mass with respect to the total mass of the present polishing liquid.

In addition, a mass ratio (content of the organic acid/ content of hydrogen peroxide) of the content of the organic acid to the content of hydrogen peroxide is preferably 0.001 to 10, more preferably 0.01 to 1.0, and still more preferably 0.05 to 1.0.

<Water>

It is preferable that the present polishing liquid contains water. The water contained in the present polishing liquid is not particularly limited, and examples thereof include ion exchange water and pure water.

A content of water is preferably 80% to 99% by mass, and more preferably 90% to 99% by mass with respect to the total mass of the present polishing liquid.

<Benzotriazole Compound>

It is also preferable that the present polishing liquid includes a benzotriazole compound (a compound having a benzotriazole structure).

The benzotriazole compound is not particularly limited as long as it is the compound having a benzotriazole structure. Among those, the benzotriazole compound is preferably a compound represented by Formula (A).

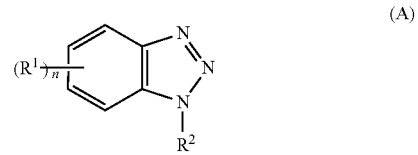

(A)

In Formula (A), $R^1$'s each independently represent a substituent.

The substituent represented by $R^1$ is preferably an alkyl group having 1 to 6 carbon atoms, an alkoxy group having 1 to 6 carbon atoms, an aryl group having 6 to 14 carbon atoms, a group represented by Formula (B), a hydroxyl group, a mercapto group, or an alkoxycarbonyl group having 1 to 6 carbon atoms.

n is an integer of 0 to 4, and in a case where n is 2 or more, n pieces of R's may be the same as or different from each other.

$R^2$ represents a hydrogen atom or a substituent.

The substituent represented by $R^2$ is preferably an alkyl group having 1 to 12 carbon atoms, an alkoxy group having 1 to 12 carbon atoms, an aryl group having 6 to 14 carbon atoms, a group represented by Formula (B), a hydroxyl group, a mercapto group, or an alkoxycarbonyl group having 1 to 12 carbon atoms.

In Formula (B), $R^3$ and $R^4$ each independently represent a hydrogen atom or a substituent (preferably an alkyl group having 1 to 10 carbon atoms).

$R^5$ represents a single bond or an alkylene group having 1 to 6 carbon atoms.

* represents a bonding site.

Examples of the benzotriazole compound include benzotriazole, 5-methyl-1H-benzotriazole, 1-hydroxybenzotriazole, 5-aminobenzotriazole, 5,6-dimethylbenzotriazole, 1-[N,N-bis(hydroxyethyl)aminoethyl]benzotriazole, 1-(1,2-dicarboxyethyl)benzotriazole, tolyltriazole, 1-[N,N-bis(2-ethylhexyl)aminomethyl]benzotriazole, 1-[N,N-bis(2-ethylhexyl)aminomethyl]methylbenzotriazole, 2,2'-{[(methyl-1H-benzotriazol-1-yl)methyl]imino}bisethanol, andcarboxybenzotriazole.

In a case where the present polishing liquid includes the benzotriazole compound, a content of the benzotriazole compound is preferably 0.0001% to 1.0% by mass, more preferably 0.0005% to 0.03% by mass, and still more preferably 0.002% to 0.008% by mass with respect to the total mass of the present polishing liquid from the viewpoint that the effect of the present invention is more excellent.

In addition, a mass ratio (content of the passivation film forming agent/content of the benzotriazole compound) of the content of the passivation film forming agent to the content of the benzotriazole compound is preferably 5 to 500, more preferably 10 to 300, and still more preferably 40 to 300.

The benzotriazole compounds may be used alone or in combination of two or more kinds thereof. In a case where two or more kinds of the benzotriazole compounds are used, a total content thereof is preferably within the range.

<Nonionic Surfactant>

It is also preferable that the present polishing liquid includes a nonionic surfactant from the viewpoint that the erosion suppressing property and/or reliability is more excellent.

Examples of the nonionic surfactant include polyalkylene oxide alkylphenyl ether-based surfactants, polyalkylene oxide alkyl ether-based surfactants, block polymer-based surfactants consisting of polyethylene oxide and polypropylene oxide, polyoxyalkylene distyrenated phenyl ether-based surfactants, polyalkylene tribenzyl phenyl ether-based surfactants, and acetylene polyalkylene oxide-based surfactants.

The nonionic surfactant is preferably a compound represented by General Formula (A1).

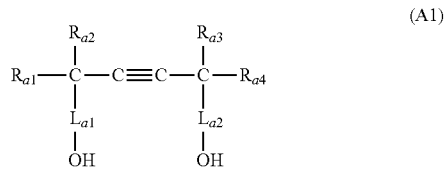

In General Formula (A1), $R_{a1}$, $R_{a2}$, $R_{a3}$ and $R_{a4}$ each independently represent an alkyl group.

The alkyl group of each of $R_{a1}$, $R_{a2}$, $R_{a3}$ and $R_{a4}$ may be linear or branched, and may have a substituent.

The alkyl group of each of $R_{a1}$, $R_{a2}$, $R_{a3}$ and $R_{a4}$ is preferably an alkyl group having 1 to 5 carbon atoms. Examples of the alkyl group having 1 to 5 carbon atoms include a methyl group, an ethyl group, an isopropyl group, and a butyl group.

In General Formula (A1), $L_{a1}$ and $L_{a2}$ each independently represent a single bond or a divalent linking group.

The divalent linking group of each of $L_{a1}$ and $L_{a2}$ is preferably an alkylene group, a $-OR_{a5}-$ group, or a combination thereof. $R_{a5}$ represents an alkylene group (preferably having 1 to 8 carbon atoms).

The compound represented by General Formula (A1) may be, for example, a compound represented by General Formula (A2).

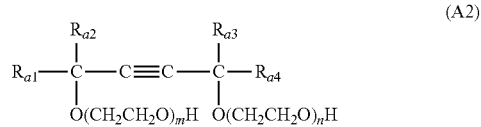

In General Formula (A2), $R_{a1}$, $R_{a2}$, $R_{a3}$, and $R_{a4}$ each independently represent an alkyl group.

The alkyl group of each of $R_{a1}$, $R_{a2}$, $R_{a3}$, and $R_{a4}$ is the same as the alkyl group of each of $R_{a1}$, $R_{a2}$, $R_{a3}$, and $R_{a4}$ in General Formula (A1).

In General Formula (A2), m and n represent the addition number of ethylene oxide, each independently represent a positive number of 0.5 to 80, and satisfy m+n≥1. Any value can be selected as long as the range satisfies m+n≥1. m and n preferably satisfy 1≤m+n≤100, and more preferably satisfy 35 m+n≤S80.

Examples of the nonionic surfactant include 2,4,7,9-tetramethyl-5-decyne-4,7-diol, 3,6-dimethyl-4-octyne-3,6-diol, 3,5-dimethyl-1-hexyne-triol, 2,5,8,11-tetramethyl-6-dodecyne-5,8-diol, 5,8-dimethyl-6-dodecyne-5,8-diol, 2,4,7,9-tetramethyl-5-decyne-4,7-diol, 4,7-dimethyl-5-decyne-4,7-diol 8-hexadecyne-7,10-diol, 7-tetradecyne-6,9-diol, 2,3,6,7-tetramethyl-4-octyne-3,6-diol, 3,6-diethyl-4-octyne-3,6-diol, 3,6-dimethyl-4-octyne-3,6-diol, and 2,5-dimethyl-3-hexyne-2,5-diol.

In addition, as the nonionic surfactant, a commercially available product may be used. Examples of the commercially available product include Surfynol 61, 82, 465, 485, DYNOL 604, 607 manufactured by Air Products & Chemicals, Inc., and OLFINE STG and OLFINE E1010 manufactured by Nissin Chemical Co., Ltd.

A hydrophile-lipophile balance (HLB) value of the nonionic surfactant is preferably 3 to 20, more preferably 8 to 17, still more preferably 8 to 15, and particularly preferably 10 to 14 from the viewpoint that the dishing suppressing property is more excellent.

Here, the HLB value is defined with a value calculated from a Griffin Formula (20 Mw/M; Mw=Molecular weight of a hydrophilic site, M=Molecular weight of a nonionic surfactant).

In a case where the present polishing liquid includes the nonionic surfactant, a content of the nonionic surfactant is preferably 0.0001% to 1.0% by mass, and more preferably 0.001% to 0.05% by mass with respect to the total mass of the present polishing liquid from the viewpoint that the effect of the present invention is more excellent.

The nonionic surfactants may be used alone or in combination of two or more kinds thereof. In a case where two or more kinds of the nonionic surfactants are used, a total content thereof is preferably within the range.

<Organic Solvent>

It is also preferable that the present polishing liquid includes an organic solvent.

The organic solvent is preferably a water-soluble organic solvent.

Examples of the organic solvent include ketone-based solvents, ether-based solvents, alcohol-based solvents, glycol-based solvents, glycol ether-based solvents, and amide-based solvents.

More specific examples thereof include acetone, methyl ethyl ketone, tetrahydrofuran, dioxane, dimethylacetamide, N-methylpyrrolidone, dimethylsulfoxide, acetonitrile, methanol, ethanol, 1-propanol, 2-propanol, 1-butanol, ethylene glycol, propylene glycol, and ethoxyethanol.

Among those, ethylene glycol is preferable.

In a case where the polishing liquid includes the organic solvent, a content of the organic solvent is preferably 0.001% to 10% by mass, more preferably 0.01% to 5.0% by mass, still more preferably 0.05% to 5.0% by mass, and particularly preferably 0.05% to 1.0% by mass with respect to the total mass of the polishing liquid from the viewpoint that the effect of the present polishing liquid is more excellent.

The organic solvents may be used alone or in combination of two or more kinds thereof. In a case where two or more kinds of the organic solvents are used in combination, a total content thereof is preferably within the range.

<pH Adjuster>

In addition to the above-mentioned components, the present polishing liquid may include a pH adjuster for adjusting a pH to a predetermined range.

Examples of the pH adjuster for adjusting a pH to an acidic side include sulfuric acid, and examples of the pH adjuster for adjusting the pH to a basic side include tetramethylammonium hydroxide (TMAH).

The pH adjuster may be used in an amount suitable for adjusting the pH to a predetermined pH.

The pH adjusters may be used alone or in combination of two or more kinds thereof.

The pH of the present polishing liquid is 8.0 to 10.5. Among those, the pH of the present polishing liquid is preferably more than 8.0 and 10.5 or less, more preferably 8.2 to 10.4, still more preferably 8.7 to 10.3, and particularly preferably 9.1 to 10.0 from the viewpoint that the dishing suppressing property and/orthe erosion suppressing property.

<Other Components>

The present polishing liquid may include components (other components) other than the above-mentioned components as long as the above-mentioned effects of the present invention are not impaired.

Examples of such other components include polymer components (preferably water-soluble polymers), nitrogen-containing heterocyclic compounds other than the benzotriazole compound, surfactants other than the above-mentioned surfactants, and particles other than colloidal silica.

<Corrosion Potential>

The present polishing liquid is preferably adjusted so that a corrosion potential of cobalt (metal cobalt) in the polishing liquid is −0.2 to 0.5 V.

The corrosion potential can be measured by the following method.

<Method for Measuring Corrosion Potential>

Device: Model 263A (trade name), Princeton Applied Research

Substrate: Co substrate (P-type, 1-35 (Ω·cm) obtained by removing a natural oxide film on a surface by performing a treatment with a 1% citric acid solution for 30 seconds The measurement procedure was as follows.

1. Clip a substrate (measurement material) which has been subjected to a pretreatment (the above-mentioned treatment for removal of a natural oxide film) as a working electrode.
2. Clip an Ag/AgCl reference electrode filled with a saturated KCl/AgCl solution as a reference electrode.
3. Clip a platinum counter electrode:TCE-1 manufactured by Princeton Applied Research as a counter electrode.
4. Put a measurement solution (the present polishing liquid) into a cell.
5. Start the measurement.
 (1) Select a Tafel plot in a linear sweep mode.
 (2) Set it to sweep at an open circuit potential of 0.5 V.
6. Read a corrosion potential from a VI graph.

<Method for Manufacturing Present Polishing Liquid>

A method for producing the present polishing liquid is not particularly limited, and a known production method can be used.

For example, the present polishing liquid may be produced by mixing each of the above-mentioned components to have a predetermined concentration.

It is also preferable to subject each of raw materials used to a desalination treatment (filtration and the like) before mixing or to mix the raw materials and then subject the mixture to a desalination treatment (filtration and the like) in order to set a mass ratio of the content of sodium to the content of potassium in the present polishing liquid to a predetermined range.

Moreover, the present polishing liquid adjusted to a high concentration (high-concentration polishing liquid) may be diluted to obtain the present polishing liquid having a desired formulation. The high-concentration polishing liquid is a mixture of which formulation is adjusted so that the present polishing liquid having a desired formulation can be produced by dilution with water or the like.

The dilution ratio in a case of diluting the high-concentration polishing liquid is preferably 2 times or more, and more preferably 2 to 10 times, on a mass basis.

The concentration of solid contents of the high-concentration polishing liquid is preferably 10% by mass or more, and more preferably 10% to 50% by mass. It is preferable to dilute the high-concentration polishing liquid to obtain the present polishing liquid having a preferred concentration of solid contents (preferably 0.1% to 10% by mass, and more preferably 1.5% by mass or more and less than 10% by mass).

Incidentally, the solid contents are intended to be all components other than water, hydrogen peroxide, and the organic solvent in the present polishing liquid.

[Chemical Mechanical Polishing Method]

A chemical mechanical polishing method of an embodiment of the present invention (hereinafter also referred to as a "CMP method") includes a step of obtaining an object to be polished, which has been polished, by bringing a surface to be polished of an object to be polished into contact with a polishing pad while supplying the above-mentioned polishing liquid to the polishing pad attached to a polishing platen, and relatively moving the object to be polished and the polishing pad to polish the surface to be polished.

<Object to Be Polished>

An object to be polished to which the CMP method according to the embodiment can be applied is not particularly limited and includes an aspect in which the object to be polished has a film containing at least one metal selected from the group consisting of copper, an copper alloy, and cobalt as a wiring line metal element, and an aspect in which the object to be polished has a cobalt-containing film is preferable.

The cobalt-containing film only needs to include at least cobalt (Co) and may include other components. The state of cobalt in the cobalt-containing film is not particularly limited, and may be, for example, a simple substance or an alloy. Above all, the cobalt in the cobalt-containing film is preferably cobalt as the simple substance. A content of cobalt (preferably cobalt as a simple substance) in the cobalt-containing film is preferably 50% to 100% by mass, more preferably 80% to 100/by mass, and still more preferably 99% to 100% by mass with respect to a total mass of the cobalt-containing film.

An example of the object to be polished can be a substrate having a cobalt-containing film on the surface.

More specific examples of the object to be polished include an object to be polished in FIG. 2 which will be described later, and the object to be polished in FIG. 2 can be obtained by, for example, subjecting the object to be pretreated shown in FIG. 1 which will be described to a pretreatment.

FIG. 1 shows a schematic view of an upper part of a cross-section showing an example of an object to be pretreated, which is subjected to a pretreatment for obtaining an object to be polished for which the present CMP method is carried out.

An object 10a to be pretreated shown in FIG. 1 includes a substrate not shown in the drawing, an interlayer insulating film 16 having a groove (for example, a groove for a wiring line) arranged on the substrate, a barrier layer 14 arranged along the shape of the groove, and a cobalt-containing film 12 arranged so that the groove is filled therewith. The cobalt-containing film with which the groove is filled is arranged at a position higher than an opening of the groove to further overflow. Such a portion of the cobalt-containing film 12, which is formed at a position higher than the opening of the groove, is referred to as a bulk layer 18.

In the object 10a to be pretreated, the barrier layer 14 which is present between the interlayer insulating film 16 and the cobalt-containing film 12 may be omitted.

The object 10a to be pretreated may have a stop layer (etching stop layer) between the cobalt-containing film 12 and the barrier layer 14, between the barrier layer 14 and the interlayer insulating film 16, and/or between the interlayer insulating film 16 and the cobalt-containing film 12 in a case where the barrier layer 14 is omitted. In addition, the barrier layer may also serve as the stop layer.

The bulk layer 18 of the object 10a to be pretreated can be removed (pretreatment) to obtain an object to be polished in FIG. 2 which will be described below.

The removal of the bulk layer 18 can be carried out by, for example, CMP using a polishing liquid different from the polishing liquid of the embodiment of the present invention.

Figure 2:
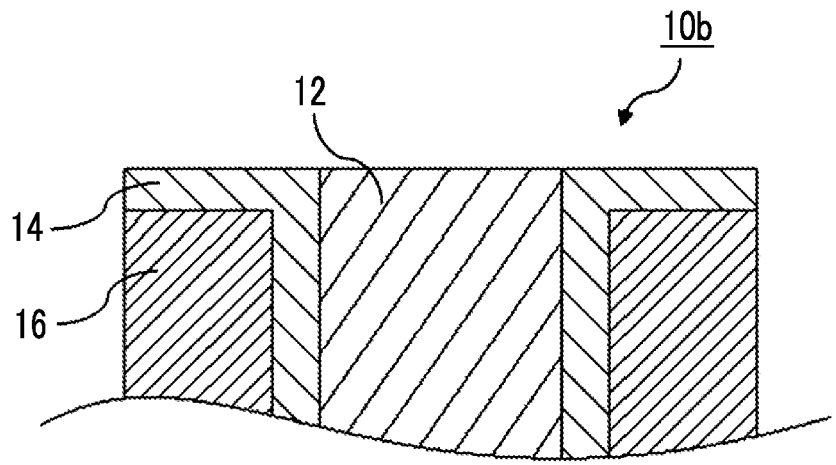
FIG. 2 is a schematic view of an upper part of a cross-section showing an example of an object to be polished for which a chemical mechanical polishing method of the embodiment of the present invention is carried out.

FIG. 2 is a schematic view of an upper part of a cross-section showing an example of an object to be polished for which the present CMP method is carried out.

In the object 10b to be polished in FIG. 2, the bulk layer is removed from the object 10a to be pretreated in FIG. 1, and thus, the barrier layer 14 and the cobalt-containing film 12 are exposed on the surface to be treated.

Figure 3:
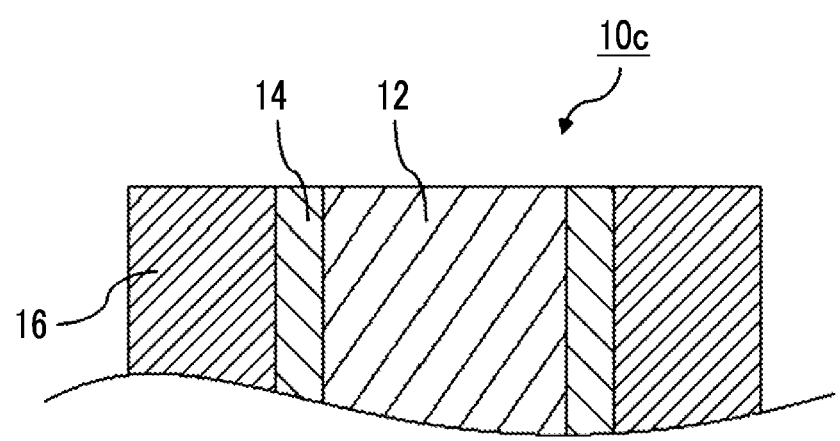
FIG. 3 is a schematic view of an upper part of a cross-section showing an example of an object to be polished, which has been polished, obtained by carrying out the chemical mechanical polishing method of the embodiment of the present invention.

In the present CMP method, it is preferable that the barrier layer 14 and the cobalt-containing film 12 exposed on the surface to be treated are polished at the same time, and the interlayer insulating film 16 is polished until it is exposed on the surface to be polished, thereby obtaining an object 10c to be polished, which has been polished, in FIG. 3 having a wiring line consisting of a cobalt-containing film.

That is, the present CMP method is preferably performed to form a wiring line consisting of a cobalt-containing film.

In addition, in the present CMP method, it is also preferable to use the present polishing liquid as a polishing liquid for a barrier.

Even after the interlayer insulating film 16 is exposed on the surface to be polished, the polishing of the interlayer insulating film 16, the barrier layer 14 arranged along the shape of the grooves of the interlayer insulating film 16, and the cobalt-containing film 12 (wiring line) with which the grooves are filled, and/or the stop layer which is contained as desired may be intentionally or unavoidably continued.

Incidentally, in the object 10b to be polished in FIG. 2, the bulk layer is completely removed, but a part of the bulk layer may not be completely removed, and the bulk layer which has not been completely removed may partially or completely cover a surface to be treated of the object 10b to be polished. In the present CMP method, such a bulk layer which has not been completely removed may also be polished and removed.

As described above, the object 10a to be pretreated may have a stop layer. Thus, the object 10b to be polished may also have a stop layer. For example, the object 10b to be polished in the state where the stop layer partially or completely covers the surface to be polished of the barrier layer 14 and/or the interlayer insulating film 16 may be obtained.

In addition, in the object 10c to be polished, which has been polished, in FIG. 3, the barrier layer 14 on the interlayer insulating film 16 is completely removed, but the polishing may be completed before the barrier layer 14 on the interlayer insulating film 16 is completely removed and cut. That is, the object 10c to be polished, which has been polished, may be obtained by finishing the polishing in the state where the barrier layer 14 partially or completely covers the interlayer insulating film 16.

As described above, the object 10b to be polished may have a stop layer. Thus, the object 10c to be polished, which has been polished, may also have a stop layer. For example, the object 1Oc to be polished, which has been polished, may be obtained by finishing polishing in the state where the stop layer partially or completely covers the interlayer insulating film 16.

Examples of the interlayer insulating film 16 include an interlayer insulating film including one or more materials selected from a group consisting of silicon nitride (SiN), silicon oxide, silicon carbide (SiC), silicon carbonitride, silicon oxycarbide (SiOC), silicon oxynitride, and tetraethoxysilane (TEOS). Among those, silicon nitride (SiN), TEOS, silicon carbide (SiC), and silicon oxycarbide (SiOC) are preferable. In addition, the interlayer insulating film 16 may be formed of a plurality of films. Examples of the interlayer insulating film formed of a plurality of films include an insulating film formed by combining a film including silicon oxide and a film including silicon oxycarbide.

Examples of the barrier layer 14 include a barrier layer including one or more materials selected from the group consisting of Ta, TaN, TiN, TiW, W, and WN. Among those, Ta, TaN, or TiN is preferable.

Examples of the stop layer include a stop layer including a material which can be used for a barrier layer and/or silicon nitride.

Specific examples of the substrate include a semiconductor substrate consisting of a single layer and a semiconductor substrate consisting of multiple layers.

Specific examples of the material constituting the semiconductor substrate consisting of a single layer include Groups Ill to V compounds such as silicon, silicon germanium, and GaAs, or any combination thereof.

Specific examples of the semiconductor substrate consisting of multiple layers include a substrate in which an exposed integrated circuit structure such as interconnect features such as a metal wire and a dielectric material is arranged on the above-mentioned semiconductor substrate such as silicon.

Examples of a commercially available products of the object to be polished to which the present CMP method is applied include SEMATECH 754TEG (manufactured by SEMATECH Inc.).

<Ratio of Polishing Speed>

As in the polishing of the object to be polished shown in FIG. 2 as described above, in the present CMP method, it is preferable that the object to be polished has a second layer (a barrier layer, a stop layer, a stop layer, and/or an interlayer insulating film, and the like) consisting of a material different from the cobalt-containing film (first layer). In addition, it is preferable that the second layer is polished at the same time as the cobalt-containing film (first layer).

That is, in the present CMP method, it is preferable that a cobalt-containing film as the first layer and a layer consisting of a material different from the cobalt-containing film (a barrier layer, a stop layer, and/or an interlayer insulating film, and the like) as the second layer are polished at the same time.

Both the first layer and the second layer may be exposed at the same time on the surface to be polished on the same plane in the polishing, as in the object to be polished shown in FIG. 2.

At this time, it is preferable that the difference between the polishing speed with respect to the first layer and the polishing speed with respect to the second layer is not extremely large from the viewpoint of the uniformity of the surface to be polished of the obtained object to be polished, which has been polished.

Specifically, a speed ratio (polishing speed of the first layer/polishing speed of the second layer) of the polishing speed of the first layer to the polishing speed of the second layer is preferably more than 0.01 and 20 or less, and more preferably more than 0.05 and less than 5.

The second layer is, for example, a barrier layer, a stop layer, and/or an interlayer insulating film. More specifically, the second layer is preferably, for example, a layer including one or more materials selected from the group consisting of Ta, TaN, TiN, SiN, tetraethoxysilane (TEOS), SiC, and SiOC. In the present CMP method, the speed ratio ("polishing speed of the cobalt-containing film (preferably Co)"/ "polishing speed of TiN, Ta, TaN, SiN, TEOS, SiOC, and/or SiC") of the polishing speed of the cobalt-containing film (preferably Co) to the polishing speed of TiN, Ta, TaN, SiN, TEOS, SiOC, and/or SiC is preferably more than 0.01 and 20 or less, and more preferably more than 0.05 and less than 5.

<Polishing Device>

A known chemical mechanical polishing device (hereinafter also referred to as a "CMP device") can be used as a polishing device with which the present CMP method can be carried out.

Examples of the CMP device include a general CMP device having a holder for holding an object to be polished having a surface to be polished, and a polishing platen to which a polishing pad is attached (to which a motor or the like with a rotation speed being changeable is attached).

<Polishing Pressure>

A polishing pressure in the present CMP method is preferably 0.1 to 5.0 psi, more preferably 0.5 to 3.0 psi, and still more preferably 1.0 to 3.0 psi from the viewpoint that generation of scratch-like defects on a surface to be polished can be suppressed and the surface to be polished after polishing is likely to be uniform. Furthermore, the polishing pressure means a pressure generated on a contact surface between the surface to be polished and the polishing pad.

<Rotation Speed of Polishing Platen>

A rotation speed of the polishing platen in the present CMP method is preferably 50 to 200 rpm, and more preferably 60 to 150 rpm.

Incidentally, in order to relatively move the object to be polished and the polishing pad, the holder may be rotated and/or rocked, the polishing platen may be rotated by planetary rotation, or a belt-shaped polishing pad may be moved linearly in one of longitudinal directions. Furthermore, the holder may be in any state of being fixed, rotating, or rocked. These polishing methods can be appropriately selected depending on a surface to be polished and/or a polishing device as long as the object to be polished and the polishing pad are relatively moved.

<Method for Supplying Polishing Liquid>

In the present CMP method, it is preferable to continuously supply the present polishing liquid to the polishing pad on the polishing platen by a pump or the like while polishing the surface to be polished. Although an amount of the present polishing liquid to be supplied is not limited, it is preferable that a surface of the polishing pad is always covered with the present polishing liquid.

For example, a supply rate of the polishing liquid is preferably 0.05 to 0.75 ml/(min·cm$^2$), more preferably 0.14 to 0.35 ml/(min·cm$^2$), and still more preferably 0.21 to 0.35 ml/(min·cm$^2$) from the viewpoint that generation of scratch-like defects on a surface to be polished can be suppressed and the surface to be polished is likely to be uniform after polishing.

Furthermore, "ml/(min·cm$^2$)" in the supply rate of the polishing liquid indicates an amount of the polishing liquid (ml) to be supplied every minute for 1 cm$^2$ of a surface to be polished during polishing.

<Cleaning Step>

It is also preferable that the present CMP method has a cleaning step of cleaning the obtained object to be polished, which has been polished, after the step of obtaining the object to be polished, which has been polished.

Residues of polishing sludge generated by polishing and/or residues based on the components included in the present polishing liquid, and the like can be removed by the cleaning step.

The cleaning liquid used in the cleaning step is not limited, and examples thereof include a cleaning liquid that is alkaline (alkaline cleaning liquid), a cleaning liquid that is acidic (acidic cleaning liquid), water, and an organic solvent, and among these, the alkaline cleaning liquid is preferable from the viewpoint that the alkaline cleaning liquid has a residue removing property and can suppress the surface roughness of a surface to be polished after washing (for example, a wiring line consisting of a cobalt-containing film exposed on the surface to be polished by the polishing step).

In addition, after the cleaning step, a post-cleaning step for removing the cleaning liquid adhering to the object to be polished, which has been polished, may be further carried out. Specific embodiments of the post-cleaning step in the present step include a method of further cleaning the object to be polished, which has been polished, after the cleaning step with a post-cleaning liquid such as an organic solvent and water.

EXAMPLES

Hereinbelow, the present invention will be described in more detail with reference to Examples. The materials, the amounts of materials used, the proportions, the treatment details, the treatment procedure, or the like shown in the Examples below may be modified as appropriate as long as the modifications do not depart from the spirit of the present invention. Therefore, the scope of the present invention should not be construed as being limited to Examples shown below. In addition, "%" means "% by mass" unless otherwise specified.

Example A

[Preparation of Polishing Liquid]
<Raw Materials>

Polishing liquids shown in Table 1 below were prepared using the following raw materials.
(Colloidal Silica)
  PL1 (product name, manufactured by Fuso Chemical Co., Ltd., colloidal silica, average primary particle diameter of 15 nm, degree of association of 2.7)
(Organic Acid)
  Malonic acid
  Citric acid (CA)
  1-Hydroxyethane-1,1-diphosphonic acid (HEDP)
  Ethylenediamintetramethylenephosphoic acid (EDTPO)
(Passivation Film Forming Agent)
  4-Methylphthalic acid
  4-Nitrophthalic acid
  Salicylic acid
  4-Methylsalicylic acid
  Anthranilic acid
  4-Methylbenzoic acid
  4-tert-Butylbenzoic acid
  4-Propylbenzoic acid
  1,4,5,8-Naphthalenetetracarboxylic acid
  6-Hydroxy-2-naphthalenecarboxylic acid
  1-Hydroxy-2-naphthalenecarboxylic acid
  3-Hydroxy-2-naphthalenecarboxylic acid
  Quinaldic acid
  8-Hydroxyquinoline
  2-Methyl-8-hydroxyquinoline
  Phthalic acid
(Anionic Surfactant)
  N-Lauroyl sarcosinate (N-LSAR)
  Dodecylbenzenesulfonic acid (DBSA)
  Lauryl phosphonic acid (LPA)
  Lauryl diphenyl ether disulfonic acid (LAPhEDSA)
  Caprylic acid
  Lignoceric acid
(Benzotriazole Compound)
  Benzotriazole (BTA)
  5-Methyl-1H-benzotriazole (5-MBTA)
(Hydrogen Peroxide)
  Hydrogen peroxide
(Organic Solvent)
  Ethylene glycol (ETG)
(Nonionic Surfactant)
  Surfynol 465 (manufactured by Nissin Chemical Co., Ltd.)
  Surfynol 61 (manufactured by Nissin Chemical Co., Ltd.)
  Surfynol 485 (manufactured by Nissin Chemical Co., Ltd.)
(Potassium (K))
  Potassium hydroxide
  (Potassium hydroxide was added as desired as a supply source of a potassium component for a polishing liquid)
(pH Adjuster)
  Sulfuric acid ($H_2SO_4$)
  Tetramethylammonium hydroxide (TMAH)
(Water)
  Water (Ultrapure water)
<Preparation of Polishing Liquid>

The respective raw materials (or aqueous solutions thereof) were subjected to a filtration treatment through a high-density polyethylene filter. At this time, an aqueous solution of colloidal silica was filtered through a filter having a pore size of 0.1 sm, and the other raw materials (or aqueous solutions thereof) were filtered through a filter having a pore size of 0.02 μm. The content of the metal components in the raw materials (or aqueous solutions thereof) was reduced by a filtration treatment. The number of times of filtration for each raw material was adjusted so that the contents of Na and K in a polishing liquid thus finally obtained were in amounts shown in the tables below.

The respective raw materials (or aqueous solutions thereof) after the filtration treatments were mixed to prepare the polishing liquid of each of Examples or Comparative Examples shown in Table 1 below.

In addition, the contents of Na and K in the raw material and the polishing liquid were measured using an Agilent 7800 triple quadrupole inductively coupled plasma mass spectrometry (ICP-MS, option #200).

The components of the produced polishing liquid are shown in the tables below.

The "Amount" column in the tables indicates the content of each component with respect to the total mass of the polishing liquid.

The descriptions of "%" and "ppt" indicate "% by mass" and "ppt by mass", respectively.

The content of each component in the tables indicates a content of each component as a compound. For example, hydrogen peroxide was added in the state of an aqueous hydrogen peroxide solution in the preparation of the polishing liquid, but the description of the content in the "Hydrogen peroxide" column in the tables indicates a content of hydrogen peroxide ($H_2O_2$) itself included in the polishing liquid, not that of the aqueous hydrogen peroxide solution added to the polishing liquid.

The content of the colloidal silica indicates a content of the silica colloidal particles themselves included in the polishing liquid.

"Na" included in the polishing liquid is derived from a trace component included in each raw material.

"K" included in the polishing liquid is derived from trace components included in each raw material and potassium hydroxide added as desired.

The description of "Adjustment" as the content of the pH adjuster indicates that either $H_2SO_4$ or TMAH is added in an amount such that the pH of a polishing liquid thus finally obtained is a value shown in the "pH" column.

The description of "Balance" as the amount of water to be added indicates that the component other than the components shown in the tables in the polishing liquid is water.

The "ΔCLogP" column shows a value of a difference (ClogP value of the anionic surfactant—ClogP value of the passivation film forming agent) obtained by subtracting the ClogP value of the passivation film forming agent from the ClogP value of the anionic surfactant.

The "Ratio 1" column shows a mass ratio (content of the passivation film forming agent/content of the anionic surfactant) of the content of the passivation film forming agent to the content of the anionic surfactant in the polishing liquid.

The "Ratio 2" column shows a mass ratio (content of the passivation film forming agent/content of the benzotriazole compound) of the content of the passivation film forming agent to the content of the benzotriazole compound in the polishing liquid.

The "Ratio 3" column shows a mass ratio (content of organic acid/content of hydrogen peroxide) of the content of the organic acid to the content of hydrogen peroxide in the polishing liquid.

The "HLB" column shows an HLB value of the nonionic surfactant.

The "K/Na" column shows a mass ratio (content of K/content of Na) of the content of K to the content of Na in the polishing liquid.

The description of "E+Number" in each cell indicates "$\times 10^{number}$".

In Table 1-1a, Table 1-1b, and Table 1-1c, the contents of the respective components in the same polishing liquid are each divided and described. For example, the polishing liquid of Example 1 includes 4.5% by mass of PL1 as colloidal silica, 0.3% by mass and 0.1% by mass of malonic acid and citric acid, each as an organic acid, 0.35% by mass of 4-methylphthalic acid as a passivation film forming agent, 0.01% by mass of LPA as an anionic surfactant, 1.0% by mass of hydrogen peroxide, 0.05% by mass of ethylene glycol as an organic solvent, $3.5 \times 10^8$ ppt by mass of K, 51 ppt by mass of Na, and a pH adjuster in an amount that brings the pH of the final polishing liquid to 9.0 as a whole, and the residual component is water.

This also applies to "Table 1-2a, Table 1-2b, Table 1-2c", "Table 1-3a, Table 1-3b, Table 1-3c", and "Table 1-4a, Table 1-4b, Table 1-4c".

TABLE 1

| Table 1-1a | Colloidal silica | | Organic acid | | Passivation film forming agent | | | Anionic surfactant | | |
|---|---|---|---|---|---|---|---|---|---|---|
| | Type | Amount (%) | Type | Amount (%) | Type | ClogP | Amount (%) | Type | ClogP | Amount (%) |
| Example 1 | PL1 | 4.5 | Malonic acid CA | 0.3 0.1 | 4-Methylphthalic acid | 1.27 | 0.35 | LPA | 4.25 | 0.01 |
| Example 2 | PL1 | 4.5 | Malonic acid CA | 0.3 0.1 | 4-Nitrophthalic acid | 1.00 | 0.35 | LPA | 4.25 | 0.01 |
| Example 3 | PL1 | 4.5 | Malonic acid CA | 0.3 0.1 | Salicylic acid | 2.06 | 0.35 | LPA | 4.25 | 0.01 |
| Example 4 | PL1 | 4.5 | Malonic acid CA | 0.3 0.1 | Anthranilic acid | 1.21 | 0.35 | LPA | 4.25 | 0.01 |
| Example 5 | PL1 | 4.5 | Malonic acid CA | 0.3 0.1 | 1,4,5,8-Naphthalenetetracarboxylic acid | 1.37 | 0.35 | LPA | 4.25 | 0.01 |
| Example 6 | PL1 | 4.5 | Malonic acid CA | 0.3 0.1 | Quinaldic acid | 2.17 | 0.35 | LPA | 4.25 | 0.01 |
| Example 7 | PL1 | 4.5 | Malonic acid CA | 0.3 0.1 | 8-Hydroxyquinoline | 1.87 | 0.35 | LPA | 4.25 | 0.01 |
| Example 8 | PL1 | 4.5 | Malonic acid CA | 0.3 0.1 | Phthalic acid | 0.81 | 0.35 | LPA | 4.25 | 0.01 |
| Example 9 | PL1 | 4.5 | Malonic acid CA | 0.3 0.1 | 4-Methylphthalic acid | 1.27 | 0.35 | LPA | 4.25 | 0.01 |
| Example 10 | PL1 | 4.5 | Malonic acid CA | 0.3 0.1 | 4-Nitrophthalic acid | 1.00 | 0.35 | LPA | 4.25 | 0.01 |
| Example 11 | PL1 | 4.5 | Malonic acid CA | 0.3 0.1 | Salicylic acid | 2.06 | 0.35 | LPA | 4.25 | 0.01 |
| Example 12 | PL1 | 4.5 | Malonic acid CA | 0.3 0.1 | Anthranilic acid | 1.21 | 0.35 | LPA | 4.25 | 0.01 |
| Example 13 | PL1 | 4.5 | Malonic acid CA | 0.3 0.1 | 1,4,5,8-Naphthalenetetracarboxylic acid | 1.37 | 0.35 | LPA | 4.25 | 0.01 |
| Example 14 | PL1 | 4.5 | Malonic acid CA | 0.3 0.1 | Phthalic acid | 0.81 | 0.35 | N-LSAR | 5.55 | 0.01 |
| Example 15 | PL1 | 4.5 | Malonic acid CA | 0.3 0.1 | 4-Methylphthalic acid | 1.27 | 0.35 | N-LSAR | 5.55 | 0.01 |
| Example 16 | PL1 | 4.5 | Malonic acid CA | 0.3 0.1 | 4-Nitrophthalic acid | 1.00 | 0.35 | N-LSAR | 5.55 | 0.01 |
| Example 17 | PL1 | 4.5 | Malonic acid CA | 0.3 0.1 | Salicylic acid | 2.06 | 0.35 | N-LSAR | 5.55 | 0.01 |

TABLE 1-continued

| Table 1-1a | Colloidal silica | | Organic acid | | Passivation film forming agent | | | Anionic surfactant | | |
|---|---|---|---|---|---|---|---|---|---|---|
| | Type | Amount (%) | Type | Amount (%) | Type | ClogP | Amount (%) | Type | ClogP | Amount (%) |
| Example 18 | PL1 | 4.5 | Malonic acid CA | 0.3 0.1 | 4-Methylsalicylic acid | 2.52 | 0.35 | N-LSAR | 5.55 | 0.01 |
| Example 19 | PL1 | 4.5 | Malonic acid CA | 0.3 0.1 | Anthranilic acid | 1.21 | 0.35 | N-LSAR | 5.55 | 0.01 |
| Example 20 | PL1 | 4.5 | Malonic acid CA | 0.3 0.1 | 4-Methylbenzoic acid | 2.36 | 0.35 | N-LSAR | 5.55 | 0.01 |
| Example 21 | PL1 | 4.5 | Malonic acid CA | 0.3 0.1 | 4-Propylbenzoic acid | 3.42 | 0.35 | N-LSAR | 5.55 | 0.01 |
| Example 22 | PL1 | 4.5 | Malonic acid CA | 0.3 0.1 | 1,4,5,8-Naphthalenetetracarboxylic acid | 1.37 | 0.35 | N-LSAR | 5.55 | 0.01 |
| Example 23 | PL1 | 4.5 | Malonic acid CA | 0.3 0.1 | 6-Hydroxy-2-naphthalenecarboxylic acid | 2.39 | 0.35 | N-LSAR | 5.55 | 0.01 |
| Example 24 | PL1 | 4.5 | Malonic acid CA | 0.3 0.1 | 1-Hydroxy-2-naphthalenecarboxylic acid | 3.29 | 0.35 | N-LSAR | 5.55 | 0.01 |
| Example 25 | PL1 | 4.5 | Malonic acid CA | 0.3 0.1 | 3-Hydroxy-2-naphthalenecarboxylic acid | 3.29 | 0.35 | N-LSAR | 5.55 | 0.01 |
| Example 26 | PL1 | 4.5 | Malonic acid CA | 0.3 0.1 | Phtalic acid | 0.81 | 0.35 | N-LSAR | 5.55 | 0.01 |
| Example 27 | PL1 | 4.5 | Malonic acid CA | 0.3 0.1 | 4-Methylphthalic acid | 1.27 | 0.35 | N-LSAR | 5.55 | 0.01 |
| Example 28 | PL1 | 4.5 | Malonic acid CA | 0.3 0.1 | 4-Nitrophtalic acid | 1.00 | 0.35 | N-LSAR | 5.55 | 0.01 |
| Example 29 | PL1 | 4.5 | Malonic acid CA | 0.3 0.1 | Salicyclic acid | 2.06 | 0.35 | N-LSAR | 5.55 | 0.01 |
| Example 30 | PL1 | 4.5 | Malonic acid CA | 0.3 0.1 | 4-Methylsalicylic acid | 2.52 | 0.35 | N-LSAR | 5.55 | 0.01 |
| Example 31 | PL1 | 4.5 | Malonic acid CA | 0.3 0.1 | Anthranilic acid | 1.21 | 0.35 | N-LSAR | 5.55 | 0.01 |
| Example 32 | PL1 | 4.5 | Malonic acid CA | 0.3 0.1 | 4-Methylbenzoic acid | 2.36 | 0.35 | N-LSAR | 5.55 | 0.01 |

TABLE 2

| Table 1-1b | Benzotrizole compound | | Hydrogen peroxide | Organic solvent | | Nonionic surfactant | | |
|---|---|---|---|---|---|---|---|---|
| | Type | Amount (%) | Amount (%) | Type | Amount (%) | Type | HLB | Amount (%) |
| Example 1 | | | 1.0 | ETG | 0.05 | | | |
| Example 2 | | | 1.0 | ETG | 0.05 | | | |
| Example 3 | | | 1.0 | ETG | 0.05 | | | |
| Example 4 | | | 1.0 | ETG | 0.05 | | | |
| Example 5 | | | 1.0 | ETG | 0.05 | | | |
| Example 6 | | | 1.0 | ETG | 0.05 | | | |
| Example 7 | | | 1.0 | ETG | 0.05 | | | |
| Example 8 | 5-MBTA | 0.003 | 1.0 | ETG | 0.05 | | | |
| Example 9 | BTA | 0.003 | 1.0 | ETG | 0.05 | | | |
| Example 10 | 5-MBTA | 0.003 | 1.0 | ETG | 0.05 | | | |
| Example 11 | 5-MBTA | 0.003 | 1.0 | ETG | 0.05 | | | |
| Example 12 | 5-MBTA | 0.003 | 1.0 | ETG | 0.05 | | | |
| Example 13 | 5-MBTA | 0.003 | 1.0 | ETG | 0.05 | | | |
| Example 14 | | | 1.0 | ETG | 0.05 | | | |
| Example 15 | | | 1.0 | ETG | 0.05 | | | |
| Example 16 | | | 1.0 | ETG | 0.05 | | | |
| Example 17 | | | 1.0 | ETG | 0.05 | | | |
| Example 18 | | | 1.0 | ETG | 0.05 | | | |
| Example 19 | | | 1.0 | ETG | 0.05 | | | |
| Example 20 | | | 1.0 | ETG | 0.05 | | | |

TABLE 3

| Table 1-1c | K Amount (ppt) | Na Amount (ppt) | K/Na | Water Amount | pH | pH Adjuster Amount | ΔClogP | Ratio 1 | Ratio 2 | Ratio 3 |
|---|---|---|---|---|---|---|---|---|---|---|
| Example 1  | 3.5E+08 | 51 | 6.9E+06 | Balance | 9.0 | Adjusted | 2.98 | 35 |     | 0.4 |
| Example 2  | 3.4E+08 | 70 | 4.8E+06 | Balance | 9.0 | Adjusted | 3.25 | 35 |     | 0.4 |
| Example 3  | 3.3E+08 | 51 | 6.4E+06 | Balance | 9.0 | Adjusted | 2.19 | 35 |     | 0.4 |
| Example 4  | 2.6E+08 | 67 | 3.9E+06 | Balance | 9.0 | Adjusted | 3.04 | 35 |     | 0.4 |
| Example 5  | 3.3E+08 | 66 | 4.9E+06 | Balance | 9.0 | Adjusted | 2.88 | 35 |     | 0.4 |
| Example 6  | 3.1E+08 | 78 | 4.0E+06 | Balance | 9.0 | Adjusted | 2.08 | 35 |     | 0.4 |
| Example 7  | 3.1E+08 | 72 | 4.4E+06 | Balance | 9.0 | Adjusted | 2.38 | 35 |     | 0.4 |
| Example 8  | 3.3E+08 | 77 | 4.2E+06 | Balance | 9.0 | Adjusted | 3.44 | 35 | 117 | 0.4 |
| Example 9  | 3.1E+08 | 80 | 3.9E+06 | Balance | 9.0 | Adjusted | 2.98 | 35 | 117 | 0.4 |
| Example 10 | 2.6E+08 | 72 | 3.6E+06 | Balance | 9.0 | Adjusted | 3.25 | 35 | 117 | 0.4 |
| Example 11 | 3.1E+08 | 76 | 4.1E+06 | Balance | 9.0 | Adjusted | 2.19 | 35 | 117 | 0.4 |
| Example 12 | 3.1E+08 | 72 | 4.3E+06 | Balance | 9.0 | Adjusted | 3.04 | 35 | 117 | 0.4 |
| Example 13 | 2.6E+08 | 57 | 4.6E+06 | Balance | 9.0 | Adjusted | 2.88 | 35 | 117 | 0.4 |
| Example 14 | 3.3E+08 | 73 | 4.4E+06 | Balance | 9.0 | Adjusted | 4.74 | 35.0 |    | 0.4 |
| Example 15 | 3.1E+08 | 75 | 4.2E+06 | Balance | 9.0 | Adjusted | 4.28 | 35 |     | 0.4 |
| Example 16 | 2.6E+08 | 75 | 3.5E+06 | Balance | 9.0 | Adjusted | 4.55 | 35 |     | 0.4 |
| Example 17 | 2.3E+08 | 73 | 3.2E+06 | Balance | 9.0 | Adjusted | 3.49 | 35 |     | 0.4 |
| Example 18 | 3.1E+08 | 73 | 4.3E+06 | Balance | 9.0 | Adjusted | 3.03 | 35 |     | 0.4 |
| Example 19 | 3.1E+08 | 68 | 4.6E+06 | Balance | 9.0 | Adjusted | 4.34 | 35 |     | 0.4 |
| Example 20 | 3.4E+08 | 69 | 4.9E+06 | Balance | 9.0 | Adjusted | 3.19 | 35 |     | 0.4 |
| Example 21 | 3.1E+08 | 66 | 4.7E+06 | Balance | 9.0 | Adjusted | 2.13 | 35 |     | 0.4 |
| Example 22 | 2.6E+08 | 52 | 5.0E+06 | Balance | 9.0 | Adjusted | 4.18 | 35 |     | 0.4 |
| Example 23 | 3.1E+08 | 46 | 6.8E+06 | Balance | 9.0 | Adjusted | 3.16 | 35 |     | 0.4 |
| Example 24 | 3.1E+08 | 70 | 4.5E+06 | Balance | 9.0 | Adjusted | 2.26 | 35 |     | 0.4 |
| Example 25 | 3.1E+08 | 78 | 4.0E+06 | Balance | 9.0 | Adjusted | 2.26 | 35 |     | 0.4 |
| Example 26 | 3.3E+08 | 72 | 4.5E+06 | Balance | 9.0 | Adjusted | 4.74 | 35 | 117 | 0.4 |
| Example 27 | 3.1E+08 | 76 | 4.1E+06 | Balance | 9.0 | Adjusted | 4.28 | 35 | 117 | 0.4 |
| Example 28 | 2.6E+08 | 77 | 3.4E+06 | Balance | 9.0 | Adjusted | 4.55 | 35 | 117 | 0.4 |
| Example 29 | 2.3E+08 | 80 | 2.9E+06 | Balance | 9.0 | Adjusted | 3.49 | 35 | 117 | 0.4 |
| Example 30 | 3.1E+08 | 72 | 4.3E+06 | Balance | 9.0 | Adjusted | 3.03 | 35 | 117 | 0.4 |
| Example 31 | 3.4E+08 | 76 | 4.4E+06 | Balance | 9.0 | Adjusted | 4.34 | 35 | 117 | 0.4 |
| Example 32 | 3.3E+08 | 77 | 4.2E+06 | Balance | 9.0 | Adjusted | 3.19 | 35 | 117 | 0.4 |

TABLE 4

| Table 1-2a | Colloidal silica Type | Amount (%) | Organic acid Type | Amount (%) | Passivation film forming agent Type | ClogP | Amount (%) | Anionic surfactant Type | ClogP | Amount (%) |
|---|---|---|---|---|---|---|---|---|---|---|
| Example 33 | PL1 | 4.5 | Malonic acid CA | 0.3 0.1 | 4-Propylbenzoic acid | 3.42 | 0.35 | N-LSAR | 5.55 | 0.01 |
| Example 34 | PL1 | 4.5 | Malonic acid CA | 0.3 0.1 | 1,4,5,8-Naphthalenetetracarboxylic acid | 1.37 | 0.35 | N-LSAR | 5.55 | 0.01 |
| Example 35 | PL1 | 4.5 | Malonic acid CA | 0.3 0.1 | 6-Hydroxy-2-naphthalenecarboxylic acid | 2.39 | 0.35 | N-LSAR | 5.55 | 0.01 |
| Example 36 | PL1 | 4.5 | Malonic acid CA | 0.3 0.1 | 1-Hydroxy-2-naphthalenecarboxylic acid | 3.29 | 0.35 | N-LSAR | 5.55 | 0.01 |
| Example 37 | PL1 | 4.5 | Malonic acid CA | 0.3 0.1 | 3-Hydroxy-2-naphthalenecarboxylic acid | 3.29 | 0.35 | N-LSAR | 5.55 | 0.01 |
| Example 38 | PL1 | 4.5 | Malonic acid CA | 0.3 0.1 | 4-Methylphthalic acid | 1.27 | 0.35 | N-LSAR | 5.55 | 0.01 |
| Example 39 | PL1 | 4.5 | Malonic acid CA | 0.3 0.1 | 4-Methylphthalic acid | 1.27 | 0.35 | N-LSAR | 5.55 | 0.01 |
| Example 40 | PL1 | 4.5 | Malonic acid CA | 0.3 0.1 | 4-Methylphthalic acid | 1.27 | 0.35 | N-LSAR | 5.55 | 0.01 |
| Example 41 | PL1 | 4.5 | HEDP | 0.1 | 4-Methylphthalic acid | 1.27 | 0.35 | N-LSAR | 5.55 | 0.01 |
| Example 42 | PL1 | 4.5 | Malonic acid CA | 0.4 0.1 | 4-Methylphthalic acid | 1.27 | 0.35 | N-LSAR | 5.55 | 0.01 |
| Example 43 | PL1 | 4.5 | Malonic acid CA | 0.003 0.001 | 4-Methylphthalic acid | 1.27 | 0.35 | N-LSAR | 5.55 | 0.01 |
| Example 44 | PL1 | 4.5 | Malonic acid CA | 0.03 0.01 | 4-Methylphthalic acid | 1.27 | 0.35 | N-LSAR | 5.55 | 0.01 |
| Example 45 | PL1 | 4.5 | Malonic acid CA | 3.0 1.0 | 4-Methylphthalic acid | 1.27 | 0.35 | N-LSAR | 5.55 | 0.01 |
| Example 46 | PL1 | 4.5 | Malonic acid CA | 0.3 0.1 | 4-Methylphthalic acid | 1.27 | 0.001 | N-LSAR | 5.55 | 0.2 |
| Example 47 | PL1 | 4.5 | Malonic acid CA | 0.3 0.1 | 4-Methylphthalic acid | 1.27 | 0.001 | N-LSAR | 5.55 | 0.1 |
| Example 48 | PL1 | 4.5 | Malonic acid CA | 0.3 0.1 | 4-Methylphthalic acid | 1.27 | 0.05 | N-LSAR | 5.55 | 0.1 |

TABLE 4-continued

| Table 1-2a | Colloidal silica | | Organic acid | | Passivation film forming agent | | | Anionic surfactant | | |
|---|---|---|---|---|---|---|---|---|---|---|
| | Type | Amount (%) | Type | Amount (%) | Type | ClogP | Amount (%) | Type | ClogP | Amount (%) |
| Example 49 | PL1 | 4.5 | Malonic acid CA | 0.3 0.1 | 4-Methylphthalic acid | 1.27 | 0.1 | N-LSAR | 5.55 | 0.1 |
| Example 50 | PL1 | 4.5 | Malonic acid CA | 0.3 0.1 | 4-Methylphthalic acid | 1.27 | 0.35 | N-LSAR | 5.55 | 0.2 |
| Example 51 | PL1 | 4.5 | Malonic acid CA | 0.3 0.1 | 4-Methylphthalic acid | 1.27 | 0.35 | N-LSAR | 5.55 | 0.1 |
| Example 52 | PL1 | 4.5 | Malonic acid CA | 0.3 0.1 | 4-Methylphthalic acid | 1.27 | 0.35 | N-LSAR | 5.55 | 0.05 |
| Example 53 | PL1 | 4.5 | Malonic acid CA | 0.3 0.1 | 4-Methylphthalic acid | 1.27 | 0.35 | N-LSAR | 5.55 | 0.003 |
| Example 54 | PL1 | 4.5 | Malonic acid CA | 0.3 0.1 | 4-Methylphthalic acid | 1.27 | 0.35 | N-LSAR | 5.55 | 0.01 |
| Example 55 | PL1 | 4.5 | Malonic acid CA | 0.3 0.1 | 4-Methylphthalic acid | 1.27 | 0.35 | N-LSAR | 5.55 | 0.01 |
| Example 56 | PL1 | 4.5 | Malonic acid CA | 0.3 0.1 | 4-Methylphthalic acid | 1.27 | 0.35 | N-LSAR | 5.55 | 0.01 |
| Example 57 | PL1 | 4.5 | Malonic acid CA | 0.3 0.1 | 4-Methylphthalic acid | 1.27 | 0.35 | N-LSAR | 5.55 | 0.01 |
| Example 58 | PL1 | 4.5 | Malonic acid CA | 0.3 0.1 | 4-Methylphthalic acid | 1.27 | 0.35 | N-LSAR | 5.55 | 0.01 |
| Example 59 | PL1 | 4.5 | Malonic acid CA | 0.3 0.1 | 4-Methylphthalic acid | 1.27 | 0.35 | N-LSAR | 5.55 | 0.01 |
| Example 60 | PL1 | 4.5 | Malonic acid CA | 0.3 0.1 | 4-Methylphthalic acid | 1.27 | 0.35 | N-LSAR | 5.55 | 0.01 |
| Example 61 | PL1 | 4.5 | Malonic acid CA | 0.3 0.1 | 4-Methylphthalic acid | 1.27 | 0.35 | LPA | 4.25 | 0.01 |
| Example 62 | PL1 | 4.5 | Malonic acid CA | 0.3 0.1 | 4-Methylphthalic acid | 1.27 | 0.35 | N-LSAR | 5.55 | 0.01 |
| Example 63 | PL1 | 4.5 | Malonic acid CA | 0.3 0.1 | 4-Methylphthalic acid | 1.27 | 0.35 | N-LSAR | 5.55 | 0.01 |
| Example 64 | PL1 | 4.5 | Malonic acid CA | 0.3 0.1 | 4-Methylphthalic acid | 1.27 | 0.35 | LPA | 4.25 | 0.01 |

TABLE 5

| Table 1-2b | Benzotriazole compound | | Hydrogen peroxide | Organic solvent | | Nonionic surfactant | | |
|---|---|---|---|---|---|---|---|---|
| | Type | Amount (%) | Amount (%) | Type | Amount (%) | Type | HLB | Amount (%) |
| Example 33 | 5-MBTA | 0.003 | 1.0 | ETG | 0.05 | | | |
| Example 34 | 5-MBTA | 0.003 | 1.0 | ETG | 0.05 | | | |
| Example 35 | 5-MBTA | 0.003 | 1.0 | ETG | 0.05 | | | |
| Example 36 | 5-MBTA | 0.003 | 1.0 | ETG | 0.05 | | | |
| Example 37 | 5-MBTA | 0.003 | 1.0 | ETG | 0.05 | | | |
| Example 38 | | | 1.0 | ETG | 0.05 | | | |
| Example 39 | | | 1.0 | ETG | 0.05 | | | |
| Example 40 | | | 1.0 | ETG | 0.05 | | | |
| Example 41 | | | 1.0 | ETG | 0.05 | | | |
| Example 42 | | | 1.0 | ETG | 0.05 | | | |
| Example 43 | | | 1.0 | ETG | 0.05 | | | |
| Example 44 | | | 1.0 | ETG | 0.05 | | | |
| Example 45 | | | 1.0 | ETG | 0.05 | | | |
| Example 46 | | | 1.0 | ETG | 0.05 | | | |
| Example 47 | | | 1.0 | ETG | 0.05 | | | |
| Example 48 | | | 1.0 | ETG | 0.05 | | | |
| Example 49 | | | 1.0 | ETG | 0.05 | | | |
| Example 50 | | | 1.0 | ETG | 0.05 | | | |
| Example 51 | | | 1.0 | ETG | 0.05 | | | |
| Example 52 | | | 1.0 | ETG | 0.05 | | | |
| Example 53 | | | 1.0 | ETG | 0.05 | | | |
| Example 54 | 5-MBTA | 0.001 | 1.0 | ETG | 0.05 | | | |
| Example 55 | 5-MBTA | 0.005 | 1.0 | ETG | 0.05 | | | |
| Example 56 | 5-MBTA | 0.01 | 1.0 | ETG | 0.05 | | | |
| Example 57 | 5-MBTA | 0.05 | 1.0 | ETG | 0.05 | | | |
| Example 58 | 5-MBTA | 0.003 | 1.0 | ETG | 0.005 | | | |
| Example 59 | 5-MBTA | 0.003 | 1.0 | ETG | 3.0 | | | |
| Example 60 | 5-MBTA | 0.003 | 1.0 | ETG | 7.0 | | | |
| Example 61 | 5-MBTA | 0.003 | 1.0 | ETG | 0.05 | | | |

TABLE 5-continued

| Table 1-2b | Benzotriazole compound | | Hydrogen peroxide | Organic solvent | | Nonionic surfactant | | |
|---|---|---|---|---|---|---|---|---|
| | Type | Amount (%) | Amount (%) | Type | Amount (%) | Type | HLB | Amount (%) |
| Example 62 | | | 1.0 | ETG | 0.05 | Surfynol 465 | 13 | 0.005 |
| Example 63 | 5-MBTA | 0.003 | 1.0 | ETG | 0.05 | Surfynol 465 | 13 | 0.005 |
| Example 64 | 5-MBTA | 0.003 | 1.0 | ETG | 0.05 | Surfynol 465 | 13 | 0.005 |

TABLE 6

| Table 1-2c | K Amount (ppt) | Na Amount (ppt) | K/Na | Water Amount | pH | pH Adjuster Amount | ΔClogP | Ratio 1 | Ratio 2 | Ratio 3 |
|---|---|---|---|---|---|---|---|---|---|---|
| Example 33 | 2.6E+08 | 70 | 3.7E+06 | Balance | 9.0 | Adjusted | 2.13 | 35 | 117 | 0.4 |
| Example 34 | 3.1E+08 | 56 | 5.6E+06 | Balance | 9.0 | Adjusted | 4.18 | 35 | 117 | 0.4 |
| Example 35 | 3.1E+08 | 59 | 5.3E+06 | Balance | 9.0 | Adjusted | 3.16 | 35 | 117 | 0.4 |
| Example 36 | 3.1E+08 | 57 | 5.5E+06 | Balance | 9.0 | Adjusted | 2.26 | 35 | 117 | 0.4 |
| Example 37 | 3.3E+08 | 58 | 5.6E+06 | Balance | 9.0 | Adjusted | 2.26 | 35 | 117 | 0.4 |
| Example 38 | 3.1E+08 | 58 | 5.3E+06 | Balance | 9.0 | Adjusted | 4.28 | 35 | | 0.4 |
| Example 39 | 2.3E+08 | 76 | 3.1E+06 | Balance | 9.0 | Adjusted | 4.28 | 35 | | 0.4 |
| Example 40 | 3.1E+08 | 73 | 4.3E+06 | Balance | 9.0 | Adjusted | 4.28 | 35 | | 0.6 |
| Example 41 | 3.4E+08 | 75 | 4.5E+06 | Balance | 9.0 | Adjusted | 4.28 | 35 | | 0.1 |
| Example 42 | 3.3E+08 | 75 | 4.3E+06 | Balance | 9.0 | Adjusted | 4.28 | 35 | | 0.5 |
| Example 43 | 3.1E+08 | 73 | 4.3E+06 | Balance | 9.0 | Adjusted | 4.28 | 35 | | 0.004 |
| Example 44 | 2.6E+08 | 73 | 3.6E+06 | Balance | 9.0 | Adjusted | 4.28 | 35 | | 0.04 |
| Example 45 | 3.1E+08 | 68 | 4.6E+06 | Balance | 9.0 | Adjusted | 4.28 | 35 | | 4.0 |
| Example 46 | 3.1E+08 | 69 | 4.5E+06 | Balance | 9.0 | Adjusted | 4.28 | 0.005 | | 0.4 |
| Example 47 | 3.1E+08 | 68 | 4.6E+06 | Balance | 9.0 | Adjusted | 4.28 | 0.01 | | 0.4 |
| Example 48 | 3.3E+08 | 69 | 4.7E+06 | Balance | 9.0 | Adjusted | 4.28 | 0.5 | | 0.4 |
| Example 49 | 3.1E+08 | 69 | 4.5E+06 | Balance | 9.0 | Adjusted | 4.28 | 1 | | 0.4 |
| Example 50 | 2.6E+08 | 74 | 3.5E+06 | Balance | 9.0 | Adjusted | 4.28 | 1.75 | | 0.4 |
| Example 51 | 2.3E+08 | 48 | 4.8E+06 | Balance | 9.0 | Adjusted | 4.28 | 3.5 | | 0.4 |
| Example 52 | 3.1E+08 | 49 | 6.4E+06 | Balance | 9.0 | Adjusted | 4.28 | 7 | | 0.4 |
| Example 53 | 3.1E+08 | 48 | 6.4E+06 | Balance | 9.0 | Adjusted | 4.28 | 117 | | 0.4 |
| Example 54 | 3.4E+08 | 51 | 6.6E+06 | Balance | 9.0 | Adjusted | 4.28 | 35 | 350 | 0.4 |
| Example 55 | 3.3E+08 | 70 | 4.7E+06 | Balance | 9.0 | Adjusted | 4.28 | 35 | 70 | 0.4 |
| Example 56 | 3.1E+08 | 51 | 6.1E+06 | Balance | 9.0 | Adjusted | 4.28 | 35 | 35 | 0.4 |
| Example 57 | 2.6E+08 | 64 | 4.1E+06 | Balance | 9.0 | Adjusted | 4.28 | 35 | 7 | 0.4 |
| Example 58 | 3.1E+08 | 67 | 4.6E+06 | Balance | 9.0 | Adjusted | 4.28 | 35 | 117 | 0.4 |
| Example 59 | 3.1E+08 | 75 | 4.2E+06 | Balance | 9.0 | Adjusted | 4.28 | 35 | 117 | 0.4 |
| Example 60 | 3.1E+08 | 53 | 5.9E+06 | Balance | 9.0 | Adjusted | 4.28 | 35 | 117 | 0.4 |
| Example 61 | 3.3E+08 | 64 | 5.1E+06 | Balance | 9.0 | Adjusted | 2.98 | 35 | 117 | 0.4 |
| Example 62 | 9.1E+07 | 32 | 2.9E+06 | Balance | 8.0 | Adjusted | 4.28 | 35 | | 0.4 |
| Example 63 | 3.5E+07 | 15 | 2.3E+06 | Balance | 8.0 | Adjusted | 4.28 | 35 | 117 | 0.4 |
| Example 64 | 7.0E+07 | 32 | 2.2E+06 | Balance | 8.0 | Adjusted | 2.98 | 35 | 117 | 0.4 |

TABLE 7

| Table 1-3a | Colloidal silica | | Organic acid | | Passivation film forming agent | | | Anionic surfactant | | |
|---|---|---|---|---|---|---|---|---|---|---|
| | Type | Amount (%) | Type | Amount (%) | Type | ClogP | Amount (%) | Type | ClogP | Amount (%) |
| Example 65 | PL1 | 4.5 | Malonic acid CA | 0.3 0.1 | 4-Methylphthalic acid | 1.27 | 0.35 | N-LSAR | 5.55 | 0.01 |
| Example 66 | PL1 | 4.5 | Malonic acid CA | 0.3 0.1 | 4-Methylphthalic acid | 1.27 | 0.35 | N-LSAR | 5.55 | 0.01 |
| Example 67 | PL1 | 4.5 | Malonic acid CA | 0.3 0.1 | 4-Methylphthalic acid | 1.27 | 0.35 | LPA | 4.25 | 0.01 |
| Example 68 | PL1 | 4.5 | Malonic acid CA | 0.3 0.1 | 4-Methylphthalic acid | 1.27 | 0.35 | N-LSAR | 5.55 | 0.01 |
| Example 69 | PL1 | 4.5 | Malonic acid CA | 0.3 0.1 | 4-Methylphthalic acid | 1.27 | 0.35 | N-LSAR | 5.55 | 0.01 |
| Example 70 | PL1 | 4.5 | Malonic acid CA | 0.3 0.1 | 4-Methylphthalic acid | 1.27 | 0.35 | LPA | 4.25 | 0.01 |
| Example 71 | PL1 | 4.5 | Malonic acid CA | 0.3 0.1 | 4-Methylphthalic acid | 1.27 | 0.35 | N-LSAR | 5.55 | 0.01 |
| Example 72 | PL1 | 4.5 | Malonic acid CA | 0.3 0.1 | 4-Methylphthalic acid | 1.27 | 0.35 | N-LSAR | 5.55 | 0.01 |
| Example 73 | PL1 | 4.5 | Malonic acid CA | 0.3 0.1 | 4-Methylphthalic acid | 1.27 | 0.35 | LPA | 4.25 | 0.01 |

TABLE 7-continued

| | Colloidal silica | | Organic acid | | Passivation film forming agent | | | Anionic surfactant | | |
|---|---|---|---|---|---|---|---|---|---|---|
| Table 1-3a | Type | Amount (%) | Type | Amount (%) | Type | ClogP | Amount (%) | Type | ClogP | Amount (%) |
| Example 74 | PL1 | 4.5 | Malonic acid / CA | 0.3 / 0.1 | 4-Methylphthalic acid | 1.27 | 0.35 | N-LSAR | 5.55 | 0.01 |
| Example 75 | PL1 | 4.5 | Malonic acid / CA | 0.3 / 0.1 | 4-Methylphthalic acid | 1.27 | 0.35 | N-LSAR | 5.55 | 0.01 |
| Example 76 | PL1 | 4.5 | Malonic acid / CA | 0.3 / 0.1 | 4-Methylphthalic acid | 1.27 | 0.35 | DBSA | 6.78 | 0.01 |
| Example 77 | PL1 | 4.5 | Malonic acid / CA | 0.3 / 0.1 | 4-Methylphthalic acid | 1.27 | 0.35 | DBSA | 6.78 | 0.01 |
| Example 78 | PL1 | 4.5 | Malonic acid / CA | 0.3 / 0.1 | 4-Methylphthalic acid | 1.27 | 0.35 | LAPhEDSA | 7.62 | 0.01 |
| Example 79 | PL1 | 4.5 | Malonic acid / CA | 0.3 / 0.1 | 4-Methylphthalic acid | 1.27 | 0.35 | LAPhEDSA | 7.62 | 0.01 |
| Example 80 | PL1 | 4.5 | Malonic acid / CA | 0.3 / 0.1 | 4-Methylphthalic acid | 1.27 | 0.35 | N-LSAR | 5.55 | 0.01 |
| Example 81 | PL1 | 4.5 | Malonic acid / CA | 0.3 / 0.1 | 4-Methylphthalic acid | 1.27 | 0.35 | LPA | 4.25 | 0.01 |
| Example 82 | PL1 | 4.5 | Malonic acid / CA | 0.3 / 0.1 | 4-Methylbenzoic acid | 2.36 | 0.35 | N-LSAR | 5.55 | 0.01 |
| Example 83 | PL1 | 6.0 | Malonic acid / CA | 0.3 / 0.1 | 4-Methylbenzoic acid | 2.36 | 0.35 | N-LSAR | 5.55 | 0.01 |
| Example 84 | PL1 | 4.5 | Malonic acid / CA | 0.3 / 0.3 | 4-Methylbenzoic acid | 2.36 | 0.35 | N-LSAR | 5.55 | 0.01 |
| Example 85 | PL1 | 4.5 | HEDP | 0.1 | 4-Methylbenzoic acid | 2.36 | 0.35 | N-LSAR | 5.55 | 0.01 |
| Example 86 | PL1 | 4.5 | Malonic acid / EDTPO | 0.4 / 0.1 | 4-Methylbenzoic acid | 2.36 | 0.35 | N-LSAR | 5.55 | 0.01 |
| Example 87 | PL1 | 4.5 | Malonic acid / CA | 0.5 / 0.3 | 4-Methylbenzoic acid | 2.36 | 0.35 | N-LSAR | 5.55 | 0.01 |
| Example 88 | PL1 | 4.5 | Malonic acid / CA | 3.0 / 1.0 | 4-Methylbenzoic acid | 2.36 | 0.35 | N-LSAR | 5.55 | 0.01 |
| Example 89 | PL1 | 4.5 | Malonic acid / CA | 5.0 / 3.0 | 4-Methylbenzoic acid | 2.36 | 0.35 | N-LSAR | 5.55 | 0.01 |
| Example 90 | PL1 | 4.5 | Malonic acid / CA | 0.3 / 0.1 | 4-Methylbenzoic acid | 2.36 | 0.001 | N-LSAR | 5.55 | 0.2 |
| Example 91 | PL1 | 4.5 | Malonic acid / CA | 0.3 / 0.1 | 4-Methylbenzoic acid | 2.36 | 0.001 | N-LSAR | 5.55 | 0.1 |
| Example 92 | PL1 | 4.5 | Malonic acid / CA | 0.3 / 0.1 | 4-Methylbenzoic acid | 2.36 | 0.05 | N-LSAR | 5.55 | 0.1 |
| Example 93 | PL1 | 4.5 | Malonic acid / CA | 0.3 / 0.1 | 4-Methylbenzoic acid | 2.36 | 0.1 | N-LSAR | 5.55 | 0.1 |
| Example 94 | PL1 | 4.5 | Malonic acid / CA | 0.3 / 0.1 | 4-Methylbenzoic acid | 2.36 | 0.35 | N-LSAR | 5.55 | 0.2 |
| Example 95 | PL1 | 4.5 | Malonic acid / CA | 0.3 / 0.1 | 4-Methylbenzoic acid | 2.36 | 0.35 | N-LSAR | 5.55 | 0.1 |
| Example 96 | PL1 | 4.5 | Malonic acid / CA | 0.3 / 0.1 | 4-Methylbenzoic acid | 2.36 | 0.35 | N-LSAR | 5.55 | 0.05 |

TABLE 8

| | Benzotriazole compound | | Hydrogen peroxide | Organic solvent | | Nonionic surfactant | | |
|---|---|---|---|---|---|---|---|---|
| Table 1-3b | Type | Amount (%) | Amount (%) | Type | Amount (%) | Type | HLB | Amount (%) |
| Example 65 | | | 1.0 | ETG | 0.05 | Surfynol 465 | 13 | 0.005 |
| Example 66 | 5-MBTA | 0.003 | 1.0 | ETG | 0.05 | Surfynol 465 | 13 | 0.005 |
| Example 67 | 5-MBTA | 0.003 | 1.0 | ETG | 0.05 | Surfynol 465 | 13 | 0.005 |
| Example 68 | | | 1.0 | ETG | 0.05 | Surfynol 465 | 13 | 0.005 |
| Example 69 | 5-MBTA | 0.003 | 1.0 | ETG | 0.05 | Surfynol 465 | 13 | 0.005 |
| Example 70 | 5-MBTA | 0.003 | 1.0 | ETG | 0.05 | Surfynol 465 | 13 | 0.005 |
| Example 71 | | | 1.0 | ETG | 0.05 | Surfynol 465 | 13 | 0.005 |
| Example 72 | 5-MBTA | 0.003 | 1.0 | ETG | 0.05 | Surfynol 465 | 13 | 0.005 |
| Example 73 | 5-MBTA | 0.003 | 1.0 | ETG | 0.05 | Surfynol 465 | 13 | 0.005 |
| Example 74 | 5-MBTA | 0.003 | 1.0 | ETG | 0.05 | Surfynol 61 | 6 | 0.005 |
| Example 75 | 5-MBTA | 0.003 | 1.0 | ETG | 0.05 | Surfynol 485 | 17 | 0.005 |
| Example 76 | | | 1.0 | ETG | 0.05 | | | |
| Example 77 | 5-MBTA | 0.003 | 1.0 | ETG | 0.05 | | | |
| Example 78 | | | 1.0 | ETG | 0.05 | | | |
| Example 79 | 5-MBTA | 0.003 | 1.0 | ETG | 0.05 | | | |
| Example 80 | 5-MBTA | 0.003 | 1.0 | ETG | 0.05 | Surfynol 465 | 13 | 0.005 |
| Example 81 | 5-MBTA | 0.003 | 1.0 | ETG | 0.05 | Surfynol 465 | 13 | 0.005 |
| Example 82 | | | 1.0 | ETG | 0.05 | | | |

TABLE 8-continued

| Table 1-3b | Benzotriazole compound Type | Amount (%) | Hydrogen peroxide Amount (%) | Organic solvent Type | Amount (%) | Nonionic surfactant Type | HLB | Amount (%) |
|---|---|---|---|---|---|---|---|---|
| Example 83 | | | 1.0 | ETG | 0.05 | | | |
| Example 84 | | | 1.0 | ETG | 0.05 | | | |
| Example 85 | | | 1.0 | ETG | 0.05 | | | |
| Example 86 | | | 1.0 | ETG | 0.05 | | | |
| Example 87 | | | 1.0 | ETG | 0.05 | | | |
| Example 88 | | | 1.0 | ETG | 0.05 | | | |
| Example 89 | | | 1.0 | ETG | 0.05 | | | |
| Example 90 | | | 1.0 | ETG | 0.05 | | | |
| Example 91 | | | 1.0 | ETG | 0.05 | | | |
| Example 92 | | | 1.0 | ETG | 0.05 | | | |
| Example 93 | | | 1.0 | ETG | 0.05 | | | |
| Example 94 | | | 1.0 | ETG | 0.05 | | | |
| Example 95 | | | 1.0 | ETG | 0.05 | | | |
| Example 96 | | | 1.0 | ETG | 0.05 | | | |

TABLE 9

| Table 1-3c | K Amount (ppt) | Na Amount (ppt) | K/Na | Water Amount | pH | pH Adjuster Amount | ΔClogP | Ratio 1 | Ratio 2 | Ratio 3 |
|---|---|---|---|---|---|---|---|---|---|---|
| Example 65 | 3.1E+08 | 72 | 4.4E+06 | Balance | 8.5 | Adjusted | 4.28 | 35 | | 0.4 |
| Example 66 | 3.1E+08 | 78 | 4.0E+06 | Balance | 8.5 | Adjusted | 4.28 | 35 | 117 | 0.4 |
| Example 67 | 3.1E+08 | 72 | 4.4E+06 | Balance | 8.5 | Adjusted | 2.98 | 35 | 117 | 0.4 |
| Example 68 | 4.6E+08 | 76 | 6.1E+06 | Balance | 9.5 | Adjusted | 4.28 | 35 | | 0.4 |
| Example 69 | 6.2E+08 | 77 | 8.1E+06 | Balance | 9.5 | Adjusted | 4.28 | 35 | 117 | 0.4 |
| Example 70 | 6.2E+08 | 80 | 7.8E+06 | Balance | 9.5 | Adjusted | 2.98 | 35 | 117 | 0.4 |
| Example 71 | 5.2E+09 | 72 | 7.2E+07 | Balance | 10.5 | Adjusted | 4.28 | 35 | | 0.4 |
| Example 72 | 4.9E+09 | 76 | 6.5E+07 | Balance | 10.5 | Adjusted | 4.28 | 35 | 117 | 0.4 |
| Example 73 | 5.5E+09 | 77 | 7.1E+07 | Balance | 10.5 | Adjusted | 2.98 | 35 | 117 | 0.4 |
| Example 74 | 2.6E+08 | 72 | 3.6E+06 | Balance | 9.0 | Adjusted | 4.28 | 35 | 117 | 0.4 |
| Example 75 | 3.1E+08 | 70 | 4.5E+06 | Balance | 9.0 | Adjusted | 4.28 | 35 | 117 | 0.4 |
| Example 76 | 3.1E+08 | 57 | 5.5E+06 | Balance | 9.0 | Adjusted | 5.51 | 35 | | 0.4 |
| Example 77 | 2.3E+08 | 64 | 3.7E+06 | Balance | 9.0 | Adjusted | 5.51 | 35 | 117 | 0.4 |
| Example 78 | 3.1E+08 | 79 | 4.0E+06 | Balance | 9.0 | Adjusted | 6.35 | 35 | | 0.4 |
| Example 79 | 2.6E+08 | 80 | 3.3E+06 | Balance | 9.0 | Adjusted | 6.35 | 35 | 117 | 0.4 |
| Example 80 | 2.1E+09 | 2 | 8.6E+08 | Balance | 9.0 | Adjusted | 4.28 | 35 | 117 | 0.4 |
| Example 81 | 3.1E+08 | 172 | 1.8E+06 | Balance | 9.0 | Adjusted | 2.98 | 35 | 117 | 0.4 |
| Example 82 | 2.6E+08 | 66 | 3.9E+06 | Balance | 9.0 | Adjusted | 3.19 | 35 | | 0.4 |
| Example 83 | 2.3E+08 | 52 | 4.5E+06 | Balance | 9.0 | Adjusted | 3.19 | 35 | | 0.4 |
| Example 84 | 3.1E+08 | 46 | 6.8E+06 | Balance | 9.0 | Adjusted | 3.19 | 35 | | 0.6 |
| Example 85 | 3.1E+08 | 77 | 4.1E+06 | Balance | 9.0 | Adjusted | 3.19 | 35 | | 0.1 |
| Example 86 | 3.4E+08 | 72 | 4.7E+06 | Balance | 9.0 | Adjusted | 3.19 | 35 | | 0.5 |
| Example 87 | 3.3E+08 | 70 | 4.6E+06 | Balance | 9.0 | Adjusted | 3.19 | 35 | | 0.8 |
| Example 88 | 3.1E+08 | 64 | 4.9E+06 | Balance | 9.0 | Adjusted | 3.19 | 35 | | 4.0 |
| Example 89 | 2.6E+08 | 81 | 3.2E+06 | Balance | 9.0 | Adjusted | 3.19 | 35 | | 8.0 |
| Example 90 | 3.1E+08 | 81 | 3.8E+06 | Balance | 9.0 | Adjusted | 3.19 | 0.005 | | 0.4 |
| Example 91 | 3.1E+08 | 81 | 3.8E+06 | Balance | 9.0 | Adjusted | 3.19 | 0.01 | | 0.4 |
| Example 92 | 3.1E+08 | 76 | 4.1E+06 | Balance | 9.0 | Adjusted | 3.19 | 0.5 | | 0.4 |
| Example 93 | 3.3E+08 | 77 | 4.2E+06 | Balance | 9.0 | Adjusted | 3.19 | 1 | | 0.4 |
| Example 94 | 3.1E+08 | 72 | 4.3E+06 | Balance | 9.0 | Adjusted | 3.19 | 1.75 | | 0.4 |
| Example 95 | 2.6E+08 | 49 | 5.3E+06 | Balance | 9.0 | Adjusted | 3.19 | 3.5 | | 0.4 |
| Example 96 | 2.3E+08 | 48 | 4.8E+06 | Balance | 9.0 | Adjusted | 3.19 | 7 | | 0.4 |

TABLE 10

| Table 1-4a | Colloidal silica Type | Amount (%) | Organic acid Type | Amount (%) | Passivation film forming agent Type | ClogP | Amount (%) | Anionic surfactant Type | ClogP | Amount (%) |
|---|---|---|---|---|---|---|---|---|---|---|
| Example 97 | PL1 | 4.5 | Malonic acid CA | 0.3 0.1 | 4-Methylbenzoic acid | 2.36 | 0.35 | N-LSAR | 5.55 | 0.003 |
| Example 98 | PL1 | 4.5 | Malonic acid CA | 0.3 0.1 | 4-Methylbenzoic acid | 2.36 | 0.35 | N-LSAR | 5.55 | 0.01 |
| Example 99 | PL1 | 4.5 | Malonic acid CA | 0.3 0.1 | 4-Methylbenzoic acid | 2.36 | 0.35 | N-LSAR | 5.55 | 0.01 |

TABLE 10-continued

| Table 1-4a | Colloidal silica Type | Amount (%) | Organic acid Type | Amount (%) | Passivation film forming agent Type | ClogP | Amount (%) | Anionic surfactant Type | ClogP | Amount (%) |
|---|---|---|---|---|---|---|---|---|---|---|
| Example 100 | PL1 | 4.5 | Malonic acid CA | 0.3 0.1 | 4-Methylbenzoic acid | 2.36 | 0.35 | N-LSAR | 5.55 | 0.01 |
| Example 101 | PL1 | 4.5 | Malonic acid CA | 0.3 0.1 | 4-Methylbenzoic acid | 2.36 | 0.35 | N-LSAR | 5.55 | 0.01 |
| Example 102 | PL1 | 4.5 | Malonic acid CA | 0.3 0.1 | 4-Methylbenzoic acid | 2.36 | 0.35 | N-LSAR | 5.55 | 0.01 |
| Example 103 | PL1 | 4.5 | Malonic acid CA | 0.3 0.1 | 4-Methylbenzoic acid | 2.36 | 0.35 | N-LSAR | 5.55 | 0.01 |
| Example 104 | PL1 | 4.5 | Malonic acid CA | 0.3 0.1 | 4-Methylbenzoic acid | 2.36 | 0.35 | N-LSAR | 5.55 | 0.01 |
| Example 105 | PL1 | 4.5 | Malonic acid CA | 0.3 0.1 | 4-Methylbenzoic acid | 2.36 | 0.35 | N-LSAR | 5.55 | 0.01 |
| Example 106 | PL1 | 4.5 | Malonic acid CA | 0.3 0.1 | 4-Methylbenzoic acid | 2.36 | 0.35 | N-LSAR | 5.55 | 0.01 |
| Example 107 | PL1 | 4.5 | Malonic acid CA | 0.3 0.1 | 4-Methylbenzoic acid | 2.36 | 0.35 | N-LSAR | 5.55 | 0.01 |
| Example 108 | PL1 | 4.5 | Malonic acid CA | 0.3 0.1 | 4-Methylbenzoic acid | 2.36 | 0.35 | N-LSAR | 5.55 | 0.01 |
| Example 109 | PL1 | 4.5 | Malonic acid CA | 0.3 0.1 | 4-Methylbenzoic acid | 2.36 | 0.35 | N-LSAR | 5.55 | 0.01 |
| Example 110 | PL1 | 4.5 | Malonic acid CA | 0.3 0.1 | 4-Methylbenzoic acid | 2.36 | 0.35 | N-LSAR | 5.55 | 0.01 |
| Example 111 | PL1 | 4.5 | Malonic acid CA | 0.3 0.1 | 4-Methylbenzoic acid | 2.36 | 0.35 | N-LSAR | 5.55 | 0.01 |
| Example 112 | PL1 | 4.5 | Malonic acid CA | 0.3 0.1 | 4-Methylbenzoic acid | 2.36 | 0.35 | N-LSAR | 5.55 | 0.01 |
| Example 113 | PL1 | 4.5 | Malonic acid CA | 0.3 0.1 | 4-Methylbenzoic acid | 2.36 | 0.35 | N-LSAR | 5.55 | 0.01 |
| Example 114 | PL1 | 4.5 | Malonic acid CA | 0.3 0.1 | 4-Methylbenzoic acid | 2.36 | 0.35 | N-LSAR | 5.55 | 0.01 |
| Example 115 | PL1 | 4.5 | Malonic acid CA | 0.3 0.1 | 4-Methylbenzoic acid | 2.36 | 0.35 | DBSA | 6.78 | 0.01 |
| Example 116 | PL1 | 4.5 | Malonic acid CA | 0.3 0.1 | 4-Methylbenzoic acid | 2.36 | 0.35 | DBSA | 6.78 | 0.01 |
| Example 117 | PL1 | 4.5 | Malonic acid CA | 0.3 0.1 | 4-Methylbenzoic acid | 2.36 | 0.35 | LAPhEDSA | 7.62 | 0.01 |
| Example 118 | PL1 | 4.5 | Malonic acid CA | 0.3 0.1 | 4-Methylbenzoic acid | 2.36 | 0.35 | LAPhEDSA | 7.62 | 0.01 |
| Example 119 | PL1 | 4.5 | Malonic acid CA | 0.3 0.1 | Phthalic acid | 0.81 | 0.35 | Caprylic acid | 2.90 | 0.01 |
| Example 120 | PL1 | 4.5 | Malonic acid CA | 0.3 0.1 | 4-tert-Butylbenzoic acid | 3.58 | 0.35 | Lignoceric acid | 11.40 | 0.01 |
| Comparative Example 1 | PL1 | 4.5 | Malonic acid CA | 0.3 0.1 | | | | N-LSAR | 5.55 | 0.01 |
| Comparative Example 2 | PL1 | 4.5 | Malonic acid CA | 0.3 0.1 | 4-Methylbenzoic acid | 2.36 | 0.2 | N-LSAR | 5.55 | 0.01 |
| Comparative Example 3 | PL1 | 4.5 | Malonic acid CA | 0.3 0.1 | 4-Methylbenzoic acid | 2.36 | 0.2 | N-LSAR | 5.55 | 0.01 |
| Comparative Example 4 | PL1 | 4.5 | Malonic acid CA | 0.3 0.1 | 4-Methylbenzoic acid | 2.36 | 0.2 | N-LSAR | 5.55 | 0.01 |
| Comparative Example 5 | PL1 | 4.5 | Malonic acid CA | 0.3 0.1 | 4-Methylbenzoic acid | 2.36 | 0.2 | N-LSAR | 5.55 | 0.01 |

TABLE 11

| Table 1-4a | Benzotriazole compound Type | Amount (%) | Hydrogen peroxide Amount (%) | Organic solvent Type | Amount (%) | Nonionic surfactant Type | HLB | Amount (%) |
|---|---|---|---|---|---|---|---|---|
| Example 97 | | | 1.0 | ETG | 0.05 | | | |
| Example 98 | 5-MBTA | 0.001 | 1.0 | ETG | 0.05 | | | |
| Example 99 | 5-MBTA | 0.005 | 1.0 | ETG | 0.05 | | | |
| Example 100 | 5-MBTA | 0.01 | 1.0 | ETG | 0.05 | | | |
| Example 101 | 5-MBTA | 0.05 | 1.0 | ETG | 0.05 | | | |
| Example 102 | 5-MBTA | 0.003 | 1.0 | ETG | 0.5 | | | |
| Example 103 | 5-MBTA | 0.003 | 1.0 | ETG | 3 | | | |
| Example 104 | 5-MBTA | 0.003 | 1.0 | ETG | 7 | | | |
| Example 105 | | | 1.0 | ETG | 0.05 | Surfynol 465 | 13 | 0.005 |
| Example 106 | 5-MBTA | 0.003 | 1.0 | ETG | 0.05 | Surfynol 465 | 13 | 0.005 |
| Example 107 | | | 1.0 | ETG | 0.05 | Surfynol 465 | 13 | 0.005 |

TABLE 11-continued

| Table 1-4a | Benzotriazole compound Type | Amount (%) | Hydrogen peroxide Amount (%) | Organic solvent Type | Amount (%) | Nonionic surfactant Type | HLB | Amount (%) |
|---|---|---|---|---|---|---|---|---|
| Example 108 | 5-MBTA | 0.003 | 1.0 | ETG | 0.05 | Surfynol 465 | 13 | 0.005 |
| Example 109 | | | 1.0 | ETG | 0.05 | Surfynol 465 | 13 | 0.005 |
| Example 110 | 5-MBTA | 0.003 | 1.0 | ETG | 0.05 | Surfynol 465 | 13 | 0.005 |
| Example 111 | | | 1.0 | ETG | 0.05 | Surfynol 465 | 13 | 0.005 |
| Example 112 | 5-MBTA | 0.003 | 1.0 | ETG | 0.05 | Surfynol 465 | 13 | 0.005 |
| Example 113 | 5-MBTA | 0.003 | 1.0 | ETG | 0.05 | Surfynol 61 | 6 | 0.005 |
| Example 114 | 5-MBTA | 0.003 | 1.0 | ETG | 0.05 | Surfynol 485 | 17 | 0.005 |
| Example 115 | | | 1.0 | ETG | 0.05 | | | |
| Example 116 | 5-MBTA | 0.003 | 1.0 | ETG | 0.05 | | | |
| Example 117 | | | 1.0 | ETG | 0.05 | | | |
| Example 118 | 5-MBTA | 0.003 | 1.0 | ETG | 0.05 | | | |
| Example 119 | 5-MBTA | 0.003 | 1.0 | ETG | 0.05 | | | |
| Example 120 | 5-MBTA | 0.003 | 1.0 | ETG | 0.05 | | | |
| Comparative Example 1 | | | | ETG | 0.05 | | | |
| Comparative Example 2 | | | | ETG | 0.05 | | | |
| Comparative Example 3 | | | | ETG | 0.05 | | | |
| Comparative Example 4 | | | | ETG | 0.05 | | | |
| Comparative Example 5 | | | | ETG | 0.05 | | | |

TABLE 12

| Table 1-4c | K Amount (ppt) | Na Amount (ppt) | K/Na | Water Amount | pH | pH Adjuster Amount | ΔClogP | Ratio 1 | Ratio 2 | Ratio 3 |
|---|---|---|---|---|---|---|---|---|---|---|
| Example 97 | 3.1E+08 | 51 | 6.1E+06 | Balance | 9.0 | Adjusted | 3.19 | 117 | | 0.4 |
| Example 98 | 3.1E+08 | 70 | 4.5E+06 | Balance | 9.0 | Adjusted | 3.19 | 35 | 350 | 0.4 |
| Example 99 | 3.1E+08 | 51 | 6.1E+06 | Balance | 9.0 | Adjusted | 3.19 | 35 | 70 | 0.4 |
| Example 100 | 2.3E+08 | 64 | 3.7E+06 | Balance | 9.0 | Adjusted | 3.19 | 35 | 35 | 0.4 |
| Example 101 | 3.1E+08 | 67 | 4.6E+06 | Balance | 9.0 | Adjusted | 3.19 | 35 | 7 | 0.4 |
| Example 102 | 3.1E+08 | 75 | 4.2E+06 | Balance | 9.0 | Adjusted | 3.19 | 35 | 117 | 0.4 |
| Example 103 | 3.4E+08 | 53 | 6.3E+06 | Balance | 9.0 | Adjusted | 3.19 | 35 | 117 | 0.4 |
| Example 104 | 3.3E+08 | 64 | 5.1E+06 | Balance | 9.0 | Adjusted | 3.19 | 35 | 117 | 0.4 |
| Example 105 | 3.2E+07 | 13 | 2.5E+06 | Balance | 8.0 | Adjusted | 3.19 | 35 | | 0.4 |
| Example 106 | 5.0E+07 | 32 | 2.4E+06 | Balance | 8.0 | Adjusted | 3.19 | 35 | 117 | 0.4 |
| Example 107 | 3.1E+08 | 78 | 4.0E+06 | Balance | 8.5 | Adjusted | 3.19 | 35 | | 0.4 |
| Example 108 | 3.1E+08 | 72 | 4.4E+06 | Balance | 8.5 | Adjusted | 3.19 | 35 | 117 | 0.4 |
| Example 109 | 6.5E+08 | 48 | 1.3E+07 | Balance | 9.5 | Adjusted | 3.19 | 35 | | 0.4 |
| Example 110 | 6.2E+08 | 51 | 1.2E+07 | Balance | 9.5 | Adjusted | 3.19 | 35 | 117 | 0.4 |
| Example 111 | 4.2E+09 | 51 | 8.2E+07 | Balance | 10.5 | Adjusted | 3.19 | 35 | | 0.4 |
| Example 112 | 4.9E+09 | 64 | 7.7E+07 | Balance | 10.5 | Adjusted | 3.19 | 35 | 117 | 0.4 |
| Example 113 | 3.3E+08 | 75 | 4.4E+06 | Balance | 9.0 | Adjusted | 3.19 | 35 | 117 | 0.4 |
| Example 114 | 3.1E+08 | 64 | 4.9E+06 | Balance | 9.0 | Adjusted | 3.19 | 35 | 117 | 0.4 |
| Example 115 | 2.6E+08 | 67 | 3.9E+06 | Balance | 9.0 | Adjusted | 4.42 | 35 | | 0.4 |
| Example 116 | 2.3E+08 | 75 | 3.1E+06 | Balance | 9.0 | Adjusted | 4.42 | 35 | 117 | 0.4 |
| Example 117 | 3.1E+08 | 64 | 4.9E+06 | Balance | 9.0 | Adjusted | 5.26 | 35 | | 0.4 |
| Example 118 | 3.1E+08 | 67 | 4.6E+06 | Balance | 9.0 | Adjusted | 5.26 | 35 | 117 | 0.4 |
| Example 119 | 3.4E+08 | 75 | 4.5E+06 | Balance | 9.0 | Adjusted | 2.09 | 35 | 117 | 0.4 |
| Example 120 | 3.3E+08 | 64 | 5.1E+06 | Balance | 9.0 | Adjusted | 7.82 | 35 | 117 | 0.4 |
| Comparative Example 1 | 3.1E+08 | 67 | 4.6E+06 | Balance | 9.0 | Adjusted | | | | |
| Comparative Example 2 | 3.1E+08 | 53 | 5.9E+06 | Balance | 7.5 | Adjusted | 3.19 | 20 | | |
| Comparative Example 3 | 3.1E+10 | 64 | 4.9E+08 | Balance | 11.0 | Adjusted | 3.19 | 20 | | |
| Comparative Example 4 | 2.3E+08 | 0.2 | 1.2E+09 | Balance | 9.0 | Adjusted | 3.19 | 20 | | |
| Comparative Example 5 | 3.1E+08 | 3815 | 8.2E+04 | Balance | 9.0 | Adjusted | 3.19 | 20 | | |

[Tests]

The following evaluations were each performed using the obtained polishing liquids.

<Evaluation of Dishing Suppressing Property>

A wafer was polished under the conditions that a polishing pressure was set to 2.0 psi and a supply rate of the polishing liquid was set to 0.28 ml/(min·cm$^2$), using FREX300SII (polishing device). Incidentally, in the wafer, an interlayer insulating film consisting of silicon oxide was formed on a silicon substrate having a diameter of 12 inches (30.48 cm), and the interlayer insulating film was engraved with a groove having a line-and-space pattern consisting of a line of 10 μm and a space of 10 μm. A barrier layer (material: TiN, film thickness: 10 num) was arranged along the shape of the groove, and the groove was filled with Co. Further, a bulk layer consisting of Co, having a film thickness of 150 to 300 nm, was formed on an upper part of a line-and-space part so that Co overflowed from the groove.

First, Co (bulk layer) of the non-wiring part was completely polished using CSL5250C (trade name, manufactured by FUJIFILM Planar Solutions, LLC) as a polishing liquid, and then polishing was further performed for 10 seconds. Thereafter, the wafer in which the barrier layer covered the interlayer insulating film was polished using the polishing liquid of each of Examples or Comparative Examples for 1 minute under the same conditions to remove the barrier layer on the interlayer insulating film.

A level difference (height difference) between a reference surface (the highest position in the wafer after polishing) and the central portion of a line part (a portion in which each wiring line was formed) on the wafer after polishing was measured, and an average value of the level differences in the entire wafer was classified according to the following categories.

The level difference is dishing, and it can be evaluated that the smaller the level difference (an average value of the level differences) is, the more excellent the dishing suppressing property is.

AAA: The level difference is less than 1 nm
AA: The level difference is 1 nm or more and less than 3 nm
A: The level difference is 3 nm or more and less than 5 nm
B: The level difference is 5 nm or more and less than 8 nm
C: The level difference is 8 nm or more and less than 10 nm
D: The level difference is 10 nm or more <Evaluation of Erosion Suppressing Property—1>

Wafer polishing was performed in the same manner as in <Evaluation of Dishing Suppressing Property>, except that the line-and-space of the wafer used in the test was configured to have a line of 9 μm and a space of 1 μm.

A level difference (height difference) between a reference surface (the highest position in the wafer after polishing) and a central portion of the space part (a portion in which a barrier layer or an interlayer insulating film was exposed) on the wafer after polishing was measured, and an average value of the level differences in the entire wafer was classified according to the following categories.

The level difference is erosion, and it can be evaluated that the smaller the level difference (an average value of the level differences) is, the more excellent the erosion suppressing property is.

AAA: The level difference is less than 5 nm
AA: The level difference is 5 nm or more and less than 8 nm
A: The level difference is 8 nm or more and less than 10 nm
B: The level difference is 10 nm or more and less than 12 nm
C: The level difference is 12 nm or more and less than 15 nm
D: The level difference is 15 nm or more <Reliability>

A BDII wafer was polished for 60 seconds under the conditions that a polishing pressure was set to 2.0 psi and a supply rate of the polishing liquid was set to 0.28 ml/(min·cm$^2$), using FREX300SII (polishing device), using the polishing liquid in Table 1. The wafer after polishing was baked (heated) at 200° C. for 30 seconds to remove water in the wafer.

Incidentally, the BDII wafer is a wafer in which black diamond (silicon carbide, a low dielectric constant (Low-k) material manufactured by Applied Materials, Inc.) is arranged on silicon.

A k value (relative permittivity) on a surface of the black diamond which had not been subjected to a polishing treatment and a k value on a surface of the black diamond which had been subjected to a polishing treatment were checked, and the reliability was evaluated based on the difference (a rise value of the k value due to the polishing treatment). The smaller the difference is, the better the reliability is.

A: The rise value in the k value is less than 0.05
B: The rise value in the k value is 0.05 or more and less than 0.08
C: The rise value in the k value is 0.08 or more and less than 0.10
D: The rise value in the k value is 0.10 or more The tables below show the evaluation results of the tests performed using the polishing liquid of each of Examples or Comparative Examples.

TABLE 13

| Table 2-1 | Evaluation | | |
| --- | --- | --- | --- |
| | Dishing suppressing property | Erosion suppressing property | Reliability |
| Example 1 | A | A | B |
| Example 2 | A | A | B |
| Example 3 | A | A | B |
| Example 4 | A | A | B |
| Example 5 | A | A | B |
| Example 6 | A | A | B |
| Example 7 | A | A | B |
| Example 8 | A | A | A |
| Example 9 | A | AA | A |
| Example 10 | A | AA | A |
| Example 11 | A | AA | A |
| Example 12 | A | AA | A |
| Example 13 | A | AA | A |
| Example 14 | A | B | B |
| Example 15 | A | A | B |
| Example 16 | A | A | B |
| Example 17 | A | A | B |
| Example 18 | A | A | B |
| Example 19 | A | A | B |
| Example 20 | A | A | B |
| Example 21 | A | A | B |
| Example 22 | A | A | B |
| Example 23 | A | A | B |
| Example 24 | A | A | B |
| Example 25 | A | A | B |
| Example 26 | A | A | A |
| Example 27 | A | AA | A |
| Example 28 | A | AA | A |
| Example 29 | A | AA | A |
| Example 30 | A | AA | A |
| Example 31 | A | AA | A |
| Example 32 | A | AA | A |

TABLE 14

| Table 2-2 | Evaluation | | |
| --- | --- | --- | --- |
| | Dishing suppressing property | Erosion suppressing property | Reliability |
| Example 33 | A | AA | A |
| Example 34 | A | AA | A |
| Example 35 | A | AA | A |
| Example 36 | A | AA | A |
| Example 37 | A | AA | A |
| Example 38 | A | B | B |
| Example 39 | A | C | B |
| Example 40 | A | A | B |
| Example 41 | A | A | B |
| Example 42 | A | A | B |
| Example 43 | A | B | B |
| Example 44 | A | B | B |
| Example 45 | A | C | B |
| Example 46 | A | B | B |
| Example 47 | A | A | B |
| Example 48 | A | A | B |
| Example 49 | A | A | B |

TABLE 14-continued

| Table 2-2 | Dishing suppressing property | Erosion suppressing property | Reliability |
|---|---|---|---|
| Example 50 | A | A | B |
| Example 51 | A | A | B |
| Example 52 | A | A | B |
| Example 53 | A | B | B |
| Example 54 | A | A | A |
| Example 55 | A | AA | A |
| Example 56 | A | A | A |
| Example 57 | A | B | A |
| Example 58 | A | A | A |
| Example 59 | A | A | A |
| Example 60 | A | C | A |
| Example 61 | A | AA | A |
| Example 62 | A | A | A |
| Example 63 | A | AA | A |
| Example 64 | A | AA | A |

TABLE 15

| Table 2-3 | Dishing suppressing property | Erosion suppressing property | Reliability |
|---|---|---|---|
| Example 65 | AA | AA | A |
| Example 66 | AA | AAA | A |
| Example 67 | AA | AAA | A |
| Example 68 | AAA | AAA | A |
| Example 69 | AAA | AAA | A |
| Example 70 | AAA | AAA | A |
| Example 71 | A | AAA | A |
| Example 72 | A | AAA | A |
| Example 73 | A | AAA | A |
| Example 74 | A | AAA | A |
| Example 75 | A | AAA | A |
| Example 76 | A | A | B |
| Example 77 | A | AA | A |
| Example 78 | A | A | B |
| Example 79 | A | AA | A |
| Example 80 | AA | AA | A |
| Example 81 | AA | AAA | B |
| Example 82 | A | B | B |
| Example 83 | A | C | B |
| Example 84 | A | A | B |
| Example 85 | A | A | B |
| Example 86 | A | A | B |
| Example 87 | A | A | B |
| Example 88 | A | C | B |
| Example 89 | A | C | B |
| Example 90 | A | B | B |
| Example 91 | A | A | B |
| Example 92 | A | A | B |
| Example 93 | A | A | B |
| Example 94 | A | A | B |
| Example 95 | A | A | B |
| Example 96 | A | A | B |

TABLE 16

| Table 2-4 | Dishing suppressing property | Erosion suppressing property | Reliability |
|---|---|---|---|
| Example 97 | A | B | B |
| Example 98 | A | A | A |
| Example 99 | A | AA | A |
| Example 100 | A | A | A |
| Example 101 | A | B | A |
| Example 102 | A | AA | A |
| Example 103 | A | A | A |
| Example 104 | A | C | A |
| Example 105 | A | A | A |
| Example 106 | A | AA | A |
| Example 107 | AA | AA | A |
| Example 108 | AA | AAA | A |
| Example 109 | AAA | AAA | A |
| Example 110 | AAA | AAA | A |
| Example 111 | A | AA | A |
| Example 112 | A | AAA | A |
| Example 113 | A | AAA | A |
| Example 114 | A | AAA | A |
| Example 115 | A | A | B |
| Example 116 | A | AA | A |
| Example 117 | A | A | B |
| Example 118 | A | AA | A |
| Example 119 | A | A | A |
| Example 120 | A | AA | A |
| Comparative Example 1 | D | D | A |
| Comparative Example 2 | D | D | A |
| Comparative Example 3 | D | D | A |
| Comparative Example 4 | D | D | B |
| Comparative Example 5 | A | A | D |

From the results shown in the tables, it was confirmed that desired results could be obtained in a case of using the polishing liquid of the embodiment of the present invention.

Above all, it was confirmed that in a case where the ClogP value of the passivation film forming agent in the present polishing liquid is 1.00 to 3.80, the effect of the present invention is more excellent (see the comparison of the results of Examples 14 to 25, and the like).

It was confirmed that in a case where the present polishing liquid includes a benzotriazole compound, the effect of the present invention is more excellent (see the comparison of the results of Examples 1 to 5 and 9 to 13, and the like).

It was confirmed that the content of the benzotriazole compound in the present polishing liquid is preferably 0.0005% to 0.03% by mass, and more preferably 0.002% to 0.008% with respect to the total mass of the present polishing liquid from the viewpoint that the effect of the present invention is more excellent (see the comparison of the results of Examples 27, and 54 to 57, and the like).

It was confirmed that the content of the colloidal silica in the present polishing liquid is preferably 2.0% to 5.5% by mass, and more preferably 3.0% to 5.5% by mass with respect to the total mass of the present polishing liquid from the viewpoint that the effect of the present invention is more excellent (see the comparison of the results of Examples 15, 38, and 39, and the like).

It was confirmed that the content of the organic acid in the present polishing liquid is preferably 0.1% to 1.5% by mass with respect to the total mass of the present polishing liquid from the viewpoint that the effect of the present invention is more excellent (see the comparison of the results of Examples 15 and 40 to 45, and the like).

It was confirmed that it is preferable that the ratio (content of the passivation film forming agent/content of the anionic surfactant) of the content of the passivation film forming agent to the content of the anionic surfactant in the present polishing liquid is 0.01 or more and less than 100 with respect to the total mass of the present polishing liquid from the viewpoint that the effect of the present invention is more excellent (see the comparison of the results of Examples 15, 46, 47, and 50, and the like).

It was confirmed that the content of the organic solvent in the present polishing liquid is preferably 0.05% to 5.0% by mass, and more preferably 0.05% to 1.0% by mass with respect to the total mass of the present polishing liquid from the viewpoint that the effect of the present invention is more excellent (see the comparison of the results of Examples 27 and 58 to 60, and the like).

It was confirmed that the pH of the present polishing liquid is preferably 8.2 to 10.4, more preferably 8.7 to 10.3, and still more preferably 9.1 to 10.0 from the viewpoint that the effect of the present invention is more excellent (see the comparison of the results of Examples 62 to 73, and the like).

It was confirmed that in a case where the present polishing liquid includes a nonionic surfactant, the effect of the present invention is more excellent (see the comparison of the results of Examples 15, 27, 61, 65 to 70, 74, and 75, and the like).

It was confirmed that in a case where the HLB value of the nonionic surfactant was 8 to 15, the effect of the present invention is more excellent (see the comparison of the results of Examples 65 to 70, 74, and 75, and the like).

It was confirmed that the ratio (content of potassium/content of sodium) of the content of potassium to the content of sodium in the present polishing liquid is preferably $2 \times 10$, to $1 \times 10^8$ from the viewpoint that the effect of the present invention is more excellent (see the comparison of the results of Examples 66, 67, 69, 70, 80, and 81, and the like).

It was confirmed that in a case where the mass ratio (content of passivation film forming agent/content of benzotriazole compound) of the content of the passivation film forming agent to the content of the benzotriazole compound in the present polishing liquid is 40 to 300, the effect of the present invention is more excellent (see the comparison of the results of Examples 27, and 54 to 57, and the like).

It was confirmed that in a case where the mass ratio (content of organic acid/content of hydrogen peroxide) of the content of the organic acid to the content of hydrogen peroxide in the present polishing liquid is 0.05 to 1.0, the effect of the present invention is more excellent (see the comparison of the results of Examples 15 and 43 to 45, and the like).

Furthermore, in a case where the corrosion potential of cobalt in the present polishing liquid (polishing liquid of Examples) was measured by the method described above in the specification, all of the values were in the range of −0.2 to 0.5 V.

In addition, the same polishing liquid as that of Example 1, except that the formulation was controlled to adjust the amount of the pH adjuster to be added in order to lower the pH to a pH of 8.0 to 9.0 and the corrosion potential was 0.51 V or more, was prepared. In a case where the same test was carried out using the present polishing liquid, the same results as those of the polishing liquid of Example 1 were obtained except that the result of an erosion suppressing property was lowered to B.

Example B

Further, the following tests were performed while changing a polishing pressure (a contact pressure for contacting the surface to be polished and the polishing pad), using the polishing liquid of each of Examples 68, 69, 70, 109, and 110 described above.

[Tests]
<Evaluation of Scratch Suppressing Property—1>

The same wafer as used in <Evaluation of Dishing Suppressing Property> was polished under the conditions that a supply rate of the polishing liquid was fixed at 0.28 ml/(min·cm$^2$) and a polishing pressure was set as shown in Table 3, using FREX300SII (polishing device). First, Co (bulk layer) of the non-wiring part was completely polished using CSL5250C as a polishing liquid, and then polishing was further performed for 10 seconds. Thereafter, the wafer in which the barrier layer covered the interlayer insulating film was polished using a polishing liquid shown in Table 3 for 1 minute under the same conditions to remove the barrier layer on the interlayer insulating film. The wafer after the polishing was cleaned with a cleaning liquid (pCMP liquid) (alkaline cleaning liquid: CL9010 (manufactured by Fujifilm Electronics Materials Co., Ltd.)) for 1 minute in a cleaning unit, further subjected to isopropanol (IPA) cleaning for 30 minutes, and then subjected to a drying treatment.

The obtained wafer was measured by a defect detection device, coordinates where defects having a major diameter of 0.06 μm or more were present were identified, and then the types of the defects at the identified coordinates were classified. The number of scratches (scratch-like defects) detected on the wafer was classified according to the following categories.

It can be evaluated that the smaller the number of the scratches is, the more excellent the scratch suppressing property is.

AAA: The number of the scratches is 1 or less
AA: The number of the scratches is 2 or 3
A: The number of the scratches is 4 or 5
B: The number of the scratches is 6 to 10
C: The number of the scratches is 11 to 15
D: The number of the scratches is 16 or more <Evaluation of Uniformity—1>

A polished wafer was obtained according to the method described in <Evaluation of Erosion Suppressing Property> described above, except that the polishing pressures were each changed to be ones as shown in Table 3.

For the wafer after polishing, a level difference of each of a chip formed in the vicinity of the center of the polished surface and a chip formed in the vicinity of the edge of the polished surface was measured, and a difference between the level difference measured in the vicinity of the center and the level difference in the vicinity of the edge was classified according to the following categories.

Furthermore, the level difference as mentioned herein is a total value of the erosion value (height difference between the reference surface and the central portion of the space part) and the dishing value (height difference between the reference surface and the central portion of the line part).

It can be evaluated that the smaller the difference between the level differences is, the more excellent the uniformity is.

AAA: The difference in the level difference is less than 3 nm
AA: The difference in the level difference is 3 nm or more and less than 5 nm
A: The difference in the level difference is 5 nm or more and less than 8 nm
B: The difference in the level difference is 8 nm or more and less than 10 nm
C: The difference in the level difference is 10 nm or more The evaluation results of the tests performed while changing the contact pressure are shown below.

TABLE 17

| | | Polishing pressure (psi) | | | | | |
|---|---|---|---|---|---|---|---|
| Table 3 | | 0.25 | 0.50 | 1.00 | 2.00 | 3.00 | 3.50 |
| Example 68 | Scratch suppressing property | AA | AAA | AAA | AAA | AAA | B |
| | Uniformity | C | AA | AAA | AAA | AAA | B |
| Example 69 | Scratch suppressing property | AA | AAA | AAA | AAA | AAA | B |
| | Uniformity | C | AA | AAA | AAA | AAA | B |
| Example 70 | Scratch suppressing property | AA | AAA | AAA | AAA | AAA | B |
| | Uniformity | C | AA | AAA | AAA | AAA | B |
| Example 109 | Scratch suppressing property | AA | AAA | AAA | AAA | AAA | B |
| | Uniformity | C | AA | AAA | AAA | AAA | B |
| Example 110 | Scratch suppressing property | AA | AAA | AAA | AAA | AAA | B |
| | Uniformity | C | AA | AAA | AAA | AAA | B |

As shown in the table, it was confirmed that the polishing pressure is preferably 0.5 to 3.0 psi, and more preferably 1.0 to 3.0 psi.

Example C

Further, the following tests were performed while changing the following supply rate of the polishing liquid (a supply amount of the polishing liquid supplied to the polishing pad during polishing), using the polishing liquid of each of Examples 68, 69, 70, 109, and 110 described above.

[Tests]

<Evaluation of Scratch Suppressing Property—2>

Evaluation of the scratch suppressing property was performed in the same manner as in <Evaluation of Scratch Suppressing Property—1>, except that the supply rate of the polishing liquid was changed as shown in Table 4 and the polishing pressure was fixed at 2.0 psi.

<Evaluation of Uniformity—2>

Evaluation of the uniformity was performed in the same manner as in <Evaluation of Uniformity—1>, except that the supply rate of the polishing liquid was changed as shown in Table 4 and the polishing pressure was fixed at 2.0 psi.

The evaluation results of the tests performed while changing the supply rate of the polishing liquid are shown below.

TABLE 18

| | | Supply rate (ml/(min · cm$^2$)) of polishing liquid | | | | | |
|---|---|---|---|---|---|---|---|
| Table 4 | | 0.10 | 0.14 | 0.21 | 0.28 | 0.35 | 0.40 |
| Example 68 | Scratch suppressing property | C | AAA | AAA | AAA | AAA | AA |
| | Uniformity | B | AA | AAA | AAA | AAA | C |
| Example 69 | Scratch suppressing property | C | AAA | AAA | AAA | AAA | AA |
| | Uniformity | B | AA | AAA | AAA | AAA | C |
| Example 70 | Scratch suppressing property | C | AAA | AAA | AAA | AAA | AA |
| | Uniformity | B | AA | AAA | AAA | AAA | C |
| Example 109 | Scratch suppressing property | C | AAA | AAA | AAA | AAA | AA |
| | Uniformity | B | AA | AAA | AAA | AAA | C |
| Example 110 | Scratch suppressing property | C | AAA | AAA | AAA | AAA | AA |
| | Uniformity | B | AA | AAA | AAA | AAA | C |

As shown in the table, it was confirmed that the supply rate of the polishing liquid is preferably 0.14 to 0.35 ml/(min·cm$^2$), and more preferably 0.21 to 0.35 ml/(min·cm$^2$).

Example D

Further, the following tests were performed while changing the type of the cleaning liquid (pCMP liquid), using the polishing liquid of each of Examples 68, 69, 70, 109 and 110 described above.

<Evaluation of Residue Suppressing Property>

A wafer was treated in the same manner as in <Evaluation of Scratch Suppressing Property—2>, except that the supply rate of the polishing liquid was fixed at 0.28 ml/(min·cm$^2$) and the type of the cleaning liquid to be used was changed as shown in Table 5.

The obtained wafer was measured by a defect detection device, coordinates where defects having a major diameter of 0.06 μm or more were present were identified, and then the types of the defects at the identified coordinates were classified. The number of residues (residue-based defects) detected on the wafer was classified according to the following categories.

It can be evaluated that the smaller the number of the residues is, the more excellent the residue suppressing property is.

AAA: The number of the residues is less than 200
AA: The number of the residues is 200 or more and less than 350
A: The number of the residues is 350 or more and less than 500
B: The number of the residues is 500 or more and less than 750
C: The number of the residues is 750 or more and less than 1,000
D: The number of the residues is 1,000 or more Evaluation of Corrosion Suppressing Property A wafer was treated in the same manner as in <Evaluation of Scratch Suppressing Property—2>, except that the supply rate of the polishing liquid was fixed at 0.28 ml/(min·cm$^2$), the type of a cleaning liquid to be used was changed as shown in Table 5, and the line-and-space of the wafer to be used was configured to have a line of 100 μm and a space of 100 μm.

The surface roughness (Ra) on the Co wiring line (wiring line with a width of 100 μm) exposed on a surface in the surface to be polished in the obtained wafer was measured with an atomic force microscope (AFM) at N=3, and average Ra's were classified according to the following categories.

It can be evaluated that the smaller Ra is, the more excellent the corrosion suppressing propertyis.

AAA: Ra of the measured area of 5 μm is less than 1.0 nm
AA: Ra of the measured area of 5 μm is 1.0 nm or more and less than 1.5 nm
A: Ra of the measured area of 5 μm is 1.5 or more and less than 2.0 nm B: Ra of the measured area of 5 μm is 2.0 nm or more and less than 2.5 nm C: Ra of the measured area of 5 μm is 2.5 nm or more and less than 3.0 nm D: Ra of the measured area of 5 μm is 3.0 nm or more The evaluation results of the tests performed while changing the type of the cleaning liquid are shown below.

TABLE 19

| Table 5 | | Cleaning liquid | | |
|---|---|---|---|---|
| | | DIW | Acidic | Alkaline |
| Example 68 | Residue suppressing property | C | B | AAA |
| | Corrosion suppressing property | AAA | C | AAA |
| Example 69 | Residue suppressing property | C | B | AAA |
| | Corrosion suppressing property | AAA | C | AAA |
| Example 70 | Residue suppressing property | C | B | AAA |
| | Corrosion suppressing property | AAA | C | AAA |
| Example 109 | Residue suppressing property | C | B | AAA |
| | Corrosion suppressing property | AAA | C | AAA |
| Example 110 | Residue suppressing property | C | B | AAA |
| | Corrosion suppressing property | AAA | C | AAA |

DIW: Water
Acidic: CLEAN100 (manufactured by Fujifilm Electronics Materials Co., Ltd.: acidic cleaning liquid)
Alkaline: CL9010 (manufactured by Fujifilm Electronics Materials Co., Ltd.: alkaline cleaning liquid)

As shown in the table, it was confirmed that the alkaline cleaning liquid is preferable as the cleaning liquid.

Example E

Further, the following tests were performed while changing the type of the object to be polished, using the polishing liquid of each of Examples 68, 69, 70, 109, and 110 described above.

<Evaluation of Polishing Speed (RR)>

A silicon wafer having a film consisting of Co, TiN, Ta, TaN, SiN, TEOS, SiOC, or SiC on the surface was polished under the conditions that a polishing pressure was set to 2.0 psi and a supply rate of the polishing liquid was set to 0.28 ml/(min·cm$^2$), using FREX300SII (polishing device).

The film thickness before and after polishing was measured by setting a polishing time to 1 minute, a polishing speed RR (nm/min) was calculated from a difference in the film thickness, and the polishing speed was evaluated with respect to each material according to the following categories.

(Case where Film is TiN, Ta, TaN, TEOS, or SiOC)

AAA: RR is 50 nm/min or more

D: RR is less than 50 nm/min (Case where Film is SiN or SiC)

AAA: RR is 20 nm/min or more

D: RR is less than 20 nm/min (Case where Film is Co)

AAA: RR is 10 nm/min or more

D: RR is less than 10 nm/min

The evaluation results are shown below.

Furthermore, a ratio of the polishing speed of Co to the polishing speed of TiN, Ta, TaN, SiN, TEOS, SiOC, or SiC (polishing speed of Co/polishing speed of TiN, Ta, TaN, SiN, TEOS, SiOC, or SiC) was in the range of more than 0.05 and less than 5.

TABLE 20

| | Object to be polished | | | | | | | |
|---|---|---|---|---|---|---|---|---|
| Table 6 | Co | TiN | Ta | TaN | SiN | TEOS | SiOC | SiC |
| Example 68 | AAA | AAA | AAA | AAA | AAA | AAA | AAA | AAA |
| Example 69 | AAA | AAA | AAA | AAA | AAA | AAA | AAA | AAA |
| Example 70 | AAA | AAA | AAA | AAA | AAA | AAA | AAA | AAA |
| Example 109 | AAA | AAA | AAA | AAA | AAA | AAA | AAA | AAA |
| Example 110 | AAA | AAA | AAA | AAA | AAA | AAA | AAA | AAA |

As shown in the results, it was confirmed that the polishing liquid of the embodiment of the present invention has no extreme speed difference between the polishing speed for Co and the polishing speed for TiN, Ta, TaN, SiN, TEOS, SiOC, or SiC, and is suitable as a polishing liquid used for removing a barrier layer and the like.

Furthermore, in the polishing liquid of the embodiment of the present invention, the polishing speed with respect to Co can be optionally adjusted (adjusted to, for example, between 0 and 30 nm/min) by adjusting the content of hydrogen peroxide in the polishing liquid.

EXPLANATION OF REFERENCES 10a object to be pretreated
10b object to be polished
10c object to be polished, which has been polished
12 cobalt-containing film
14 barrier layer
16 interlayer insulating layer
18 bulk layer

What is claimed is:

1. A polishing liquid used for chemical mechanical polishing of an object to be polished having a cobalt-containing film, the polishing liquid comprising:
colloidal silica;
one or more organic acids selected from the group consisting of polycarboxylic acid and polyphosphonic acid;
one or more passivation film forming agents selected from the group consisting of a compound represented by General Formula (1) and a compound represented by General Formula (2);
an anionic surfactant;
hydrogen peroxide;
potassium; and
sodium, and
wherein a value of a difference obtained by subtracting the ClogP value of the passivation film forming agent from the ClogP value of the anionic surfactant is more than 2.00 and less than 8.00,
a mass ratio of a content of potassium to a content of sodium is $1 \times 10^6$ to $1 \times 10^9$, and
a pH is 8.0 to 10.5,

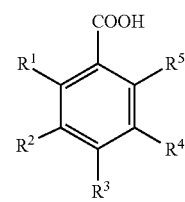

(1)

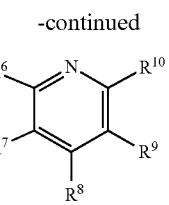

in General Formula (1), $R^1$ to $R^5$ each independently represent a hydrogen atom or a substituent, two adjacent groups in $R^1$ to $R^5$ may be bonded to each other to form a ring, and in General Formula (2), $R^6$ to $R^{10}$ each independently represent a hydrogen atom or a substituent, and two adjacent groups in $R^6$ to $R^{10}$ may be bonded to each other to form a ring.

2. The polishing liquid according to claim 1,
wherein a mass ratio of a content of the passivation film forming agent to a content of the anionic surfactant is 0.01 or more and less than 100.

3. The polishing liquid according to claim 1,
wherein a corrosion potential of cobalt in the polishing liquid is −0.2 to 0.5 V.

4. The polishing liquid according to claim 1,
wherein the organic acid is one or more selected from the group consisting of citric acid, maleic acid, succinic acid, 1-hydroxyethane-1,1-diphosphonic acid, and ethylenediaminetetramethylenephosphonic acid.

5. The polishing liquid according to claim 1,
wherein a content of the colloidal silica is 2.0% by mass or more with respect to a total mass of the polishing liquid, and
the colloidal silica has an average primary particle diameter of 5 nm or more.

6. The polishing liquid according to claim 1,
wherein the anionic surfactant has one or more anionic groups selected from the group consisting of a carboxylic acid group, a sulfonic acid group, a phosphoric acid group, a phosphonic acid group, a sulfuric acid ester group, a phosphoric acid ester group, and a group which is a salt thereof.

7. The polishing liquid according to claim 1,
wherein the ClogP value of the passivation film forming agent is 1.00 to 3.80.

8. The polishing liquid according to claim 1,
wherein the passivation film forming agent is one or more selected from the group consisting of 4-methylphthalic acid, 4-nitrophthalic acid, salicylic acid, 4-methylsalicylic acid, anthranilic acid, 4-methylbenzoic acid, 4-tert-butylbenzoic acid, 4-propylbenzoic acid, 1,4,5,8-naphthalenetetracarboxylic acid, 6-hydroxy-2-naphthalenecarboxylic acid, 1-hydroxy-2-naphthalenecarboxylic acid, 3-hydroxy-2-naphthalenecarboxylic acid, quinaldic acid, 8-hydroxyquinoline, and 2-methyl-8-hydroxyquinoline.

9. The polishing liquid according to claim 1, further comprising an organic solvent in an amount of 0.05% to 5.0% by mass with respect to a total mass of the polishing liquid.

10. The polishing liquid according to claim 1,
wherein a mass ratio of a content of the organic acid to a content of hydrogen peroxide is 0.05 to 1.0.

11. The polishing liquid according to claim 1,
wherein a concentration of solid contents is 10% by mass or more with respect to a total mass of the polishing liquid before dilution, wherein the solid contents are components other than water, the hydrogen peroxide and organic solvents further included in the polishing liquid, and
the polishing liquid is used after 2-times or more dilution with water on a mass basis.

12. The polishing liquid according to claim 1, further comprising a benzotriazole compound.

13. The polishing liquid according to claim 12,
wherein a mass ratio of a content of the passivation film forming agent to the content of the benzotriazole compound is 40 to 300.

14. The polishing liquid according to claim 1, further comprising a nonionic surfactant.

15. The polishing liquid according to claim 14,
wherein an HLB value of the nonionic surfactant is 8 to 15.

16. A chemical mechanical polishing method comprising a step of obtaining an object to be polished, which has been polished, by bringing a surface to be polished of the object to be polished into contact with a polishing pad attached to a polishing platen while supplying the polishing liquid according to claim 1 to the polishing pad, and relatively moving the object to be polished and the polishing pad to polish the surface to be polished.

17. The chemical mechanical polishing method according to claim 16,
wherein the method is performed to form a wiring line consisting of a cobalt-containing film.

18. The chemical mechanical polishing method according to claim 16,
wherein the object to be polished has a second layer consisting of a material different from that of the cobalt-containing film, and
a ratio of a polishing speed of the cobalt-containing film to a polishing speed of the second layer is more than 0.05 and less than 5.

19. The chemical mechanical polishing method according to claim 18,
wherein the second layer includes one or more materials selected from the group consisting of Ta, TaN, TiN, SiN, tetraethoxysilane, SiC, and SiOC.

20. The chemical mechanical polishing method according to claim 16,
wherein a polishing pressure is 0.5 to 3.0 psi.

21. The chemical mechanical polishing method according to claim 16,
wherein a supply rate of the polishing liquid supplied to the polishing pad is 0.14 to 0.35 ml/(min·cm$^2$).

22. The chemical mechanical polishing method according to claim 16, further comprising a step of cleaning the object to be polished, which has been polished, with an alkaline cleaning liquid after the step of obtaining the object to be polished, which has been polished.

23. A polishing liquid used for chemical mechanical polishing of an object to be polished, the polishing liquid comprising:
abrasive grains;
one or more organic acids selected from the group consisting of polycarboxylic acid and polyphosphonic acid;
one or more passivation film forming agents selected from the group consisting of a compound represented by General Formula (1) and a compound represented by General Formula (2);
an anionic surfactant;
hydrogen peroxide;
potassium; and sodium, and
wherein a value of a difference obtained by subtracting the ClogP value of the passivation film forming agent from the ClogP value of the anionic surfactant is more than 2.00 and less than 8.00,
a mass ratio of a content of potassium to a content of sodium is $1\times10^6$ to $1\times10^9$, and
a pH is 8.0 to 10.5,

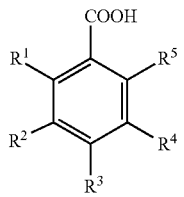
(1)

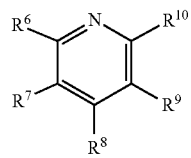
(2)

in General Formula (1), $R^1$ to $R^5$ each independently represent a hydrogen atom or a substituent, and
two adjacent groups in $R^1$ to $R^5$ may be bonded to each other to form a ring, and
in General Formula (2), $R^6$ to $R^{10}$ each independently represent a hydrogen atom or a substituent, and
two adjacent groups in $R^6$ to $R^{10}$ may be bonded to each other to form a ring.

* * * * *